(12) United States Patent
Sakiya et al.

(10) Patent No.: US 7,933,665 B2
(45) Date of Patent: Apr. 26, 2011

(54) METHOD AND SYSTEM FOR TEACHING REFERENCE POSITION OF SEMICONDUCTOR WAFER IN AUTOMATED WAFER HANDLING MANUFACTURING EQUIPMENT

(75) Inventors: Fumio Sakiya, Kannabe-cho (JP);
Yasuhisa Sato, Kannabe-cho (JP);
Tetsuya Nagao, Kannabe-cho (JP);
Toshiyuki Ikeda, Kannabe-cho (JP)

(73) Assignee: Rorze Corporation, Hiroshima (JP)

( * ) Notice: Subject to any disclaimer, the term of this patent is extended or adjusted under 35 U.S.C. 154(b) by 1664 days.

(21) Appl. No.: 10/516,337

(22) PCT Filed: Jan. 17, 2003

(86) PCT No.: PCT/JP03/00381
§ 371 (c)(1),
(2), (4) Date: Aug. 5, 2005

(87) PCT Pub. No.: WO03/101677
PCT Pub. Date: Dec. 11, 2003

(65) Prior Publication Data
US 2006/0100740 A1 May 11, 2006

(30) Foreign Application Priority Data
May 30, 2002 (JP) .................................. 2002-157393

(51) Int. Cl.
*G06F 19/00* (2006.01)
(52) U.S. Cl. ............. 700/57; 700/56; 700/121; 700/213

(58) Field of Classification Search .................. 700/218, 700/245, 56–59, 213, 246, 251; 414/754; 356/399, 400, 622; 318/568.11, 568.16
See application file for complete search history.

(56) References Cited

U.S. PATENT DOCUMENTS

| | | | |
|---|---|---|---|
| 4,819,167 A * | 4/1989 | Cheng et al. | 700/59 |
| 4,955,780 A * | 9/1990 | Shimane et al. | 414/744.2 |
| 5,483,138 A * | 1/1996 | Shmookler et al. | 318/568.16 |
| 5,706,201 A * | 1/1998 | Andrews | 700/108 |
| 5,917,601 A * | 6/1999 | Shimazaki et al. | 356/622 |
| 6,198,976 B1 * | 3/2001 | Sundar et al. | 700/59 |
| 6,405,101 B1 * | 6/2002 | Johanson et al. | 700/218 |
| 7,248,931 B2 * | 7/2007 | Raaijmakers | 700/57 |

(Continued)

FOREIGN PATENT DOCUMENTS
JP 01-132132 A 5/1989
(Continued)

*Primary Examiner* — Albert Decady
*Assistant Examiner* — Dave Robertson
(74) *Attorney, Agent, or Firm* — Oliff & Berridge, PLC

(57) ABSTRACT

In order to automate the positioning at respective ports at the start-up of an equipment in a semiconductor manufacturing equipment equipped with a positioning device and a carrying robot and enhance productivity, 2 points $W_1$ and $W_2$ at which the circumference of a disc-like object 47 such as a wafer and the locus 43 of a detection means cross are detected, and the center position A of a disc-like object is calculated using the specific point O on the perpendicular bisector 42 of the section of a line combining 2 points with these and the radius r of the disc-like object. Thereby, the carrying robot could carry out the positioning work and not only the correction of a carrying route but also the reference position teaching at the start-up of equipment could be automated using the result.

12 Claims, 31 Drawing Sheets

U.S. PATENT DOCUMENTS 7,315,373 B2 * 1/2008 Fukuzaki et al. ............. 356/399
7,433,759 B2 * 10/2008 Nangoy ........................ 700/245

FOREIGN PATENT DOCUMENTS

| | | |
|---|---|---|
| JP | 06-072513 A | 3/1994 |
| JP | 10-223732 A | 8/1998 |
| JP | 11-074330 A | 3/1999 |
| JP | 2000-068359 A | 3/2000 |
| JP | 2001-264015 A | 9/2001 |
| JP | 2002-319612 A | 10/2002 |
| WO | WO 99/02996 | 1/1999 |
| WO | A-2001-509643 | 7/2001 |

* cited by examiner

METHOD AND SYSTEM FOR TEACHING REFERENCE POSITION OF SEMICONDUCTOR WAFER IN AUTOMATED WAFER HANDLING MANUFACTURING EQUIPMENT

BACKGROUND

1. Technical Field of the Invention

The present invention relates to a method for automatically teaching a reference position which is the position of a disc-like object in a reference co-ordinate system including the position of the handling device which is required to be carried out at treating the disc-like object such as a semiconductor wafer and a device thereof; relates to an automatic positioning method using the method of determining a center position in the teaching and a device thereof; relates to a carrying method for automatically correcting a carrying route utilizing the positioning and a device thereof, and further, relates to also an automatic semiconductor manufacturing equipment utilizing those devices.

2. Related Art

As shown in FIG. 1 and FIG. 2, in general, a semiconductor manufacturing equipment 1 carries wafers by a carrying robot 4 from cassettes 6 in which semiconductor wafers and the like are stored on shelves to load lock chambers 8 which are the carrying ports of various kinds of treatment chambers 7, or from the load lock chambers 8 to the treatment chambers 7, or has a carrying device 2. As shown in FIG. 3, the carrying robot 4 is equipped with a carrying arm 12 which has a holding portion 14 which mounts or fixes wafers and the like and can move by extension and contraction, rotation and ascent and descent, and the motions of respective axes of the carrying robot 4 are controlled by a control portion 11. The control portion 11 memorizes the procedure and route of carrying and the co-ordinate information of carrying positions in the reference co-ordinate system containing the positional co-ordinate of the carrying robot 4 and dispatches motional orders to the respective axes of the carrying robot 4 based on it. Thereby, the carrying robot 4 can automatically carry a disc-like object such as a wafer 13 to a fixed carrying position and the control portion 11 is required to recognize the positional co-ordinates of the fore-mentioned carious instruments and wafers in the above-mentioned reference co-ordinate system respectively, to do so.

FIG. 26 shows a portion of the flow chart of the teaching step for determining the original co-ordinate at the start-up of the semiconductor manufacturing equipment 1 in a conventional carrying device 2 which is shown in FIG. 25. The "teaching" herein is a work for determining the reference position for delivering a wafer 13 or the like between the carrying robot 4 and the cassettes 6 and the load lock chambers 8, between a positioning device 10 or the like which is separately provided, if necessary.

For example, when the teaching is carried out with respect to a step of carrying the disc-like object such as a wafer 13 which is stored in the cassettes 6 to the load lock chamber 8, firstly, the temporary positional information (initial value) of the carrying robot 4 on design is inputted in the control portion 11 at the step S1, then the retaining portion 14 of the carrying robot 4 is moved little by little in a manual operation to the delivery position with the cassette 6 based on the design drawing by the step S2. However, the disc-like object remains to be mounted at the normal position of shelves in the cassettes 6 and remains in a condition in which it is not fixed on the retaining portion 14.

Then, as shown in FIG. 3, a guide jig 20 is installed on the holding portion 14 at the step S3 and it is visually confirmed whether the mounting position of the disc-like object is perfectly coincided with the holding position on design drawing or not. When it is deviated, the carrying robot is moved by rotation, extension and contraction, and ascent and descent in manual operation at the step S4, the position of the holding portion 14 is corrected to a proper position, and successively, the positional information obtained in the step S4 is transmitted to the control portion 11 at the step S5 to renew the initial positional information.

When there is no deviation in the confirmation at the step S3, the disc-like object retained is carried to the delivery position with the load lock chambers 8 at the step S6, and then it is visually confirmed at the step S7 whether the carrying position of the disc-like object is just as the design drawing or not. When there is deviation in an actual carrying position, the work returns to the step S4 and proceeds to the step S5. When there is no deviation, a series of the teaching are terminated.

Thereafter, the teaching work of the reference position is carried out one by one in accordance with the procedures from the step S1 to the step S7 between the positioning device 10 and the respective load lock chambers 8 with respect to the carrying robot 4 and between the respective load lock chambers 8 and other ports such as treatment chambers 7 with respect to the vacuum robot 31.

Further, the positioning of the disc-like object in conventional manufacturing steps is carried out at each time using the positioning device (proprietary machine) 10 as shown in FIG. 25. In the carrying device 2 as shown in FIG. 25, after the wafer 13 is delivered once to the disc rotational positioning device 10 which is separate from the carrying robot 4 in order to prevent that the locus of the wafer 13 during carrying is interfered with the cassettes 6 and the rims of respective inlets and outlets, the carrying robot 4 receives the wafer 13 again and usually carries it to an object position.

There is proposed in JP-B-7-27953 a method by which in order to improve productivity by the above-mentioned delivery step, the carrying arm of the carrying robot is moved while holding a wafer and passes a gate type positioning device which has luminescence portions 9a and light receiving portions 9b respectively and in which three sensors 9 which detect a wafer 13 with light fluxes 9c were provided to calculate the center position of the wafer. In the method, the reference holding position of a wafer is preliminarily taught, the route of the holding portion 14 is corrected from the transition quantity between the teaching position and the center position of a wafer which was detected by the fore-mentioned gate type positioning device, and the wafer is carried to an objective place without interfering with other instrument. Thereby, a time required for the delivery and reception for the positioning device 10 is shortened and the above-mentioned method contributed to the improvement of productivity.

Problems to be Solved by the Invention

However, as shown in the flow chart of FIG. 26, a conventional teaching work which was previously described is an all manual system by which trial and error are repeated using the guide jig 20 between all instruments with which the carrying robot 4 cooperates, while continuously visually confirming the position. Thus, this previous method required significant manual interaction. Since this requires continual manual work by a skilled technician, a time of one full day or more was necessary for only the carrying device shown in FIG. 25.

Further, as mentioned above, a gate type positioning device which is described in JP-B-7-275953 and shown in FIG. 27 is proposed as the positioning of the disc-like object in production, but since an initial teaching uses also the fore-mentioned conventional method hereat, trouble required for the start-up of equipment is not changed at all. Furthermore, since it is a device passing a gate, there is a problem that one device must be set by every inlet of respective load lock chambers and respective treatment chambers, and there has been a problem that since the device is a larger device than the diameter of a disc-like detected object such as a wafer, investment cost is enlarged. Further, since there is no positioning step before inserting a disc-like object into the fore-mentioned gate type positioning device, it has been required that the manual positioning which is troublesome as described above is preliminarily carried out so that the disc-like object is not collided with the device. When it is collided with the device by any chance, there were problems that dusts are generated without fail and it happens to damage the disc-like detected object.

Further, in the above-mentioned positioning device which is described in JP-B-7-275953, the judging method of a notching portion is geometrically illustrated, but a method of mathematically judging is not found yet. Accordingly, since a method of calculating a disc center by the minimum involution which is an approximation method is adopted, at least 3 of sensors 9 which are detection means are required and at least 7 points in total of at least 6 points on the peripheral rim of a disc and one point of the center of the disc holding portion must be measured. Further, since a point which exists on the peripheral rim of a notched portion and does not exist on a circumference is contained in the 6 points on the peripheral rim without fail, an accurate position is not strictly calculated and precision was bad. Further, there is proposed a calculation equation of determining the radius of a disc from 4 points on the peripheral rim which does not include the notched portion based on known Pythagorean theorem, but since the point on the notched portion cannot be excluded, the accurate radius of a disc could not be really determined.

SUMMARY OF THE INVENTION

Means for Solving Problems

As a result of intensively studying for solving these problems, the present invention develops a novel and strict calculation method, measures and calculates the transition quantity of the center position of a disc-like object such as a wafer, and proposes a novel automatic teaching method which realizes the rapid start-up of semiconductor equipment and an automatic positioning method. Further, the present invention proposes also an automatic teaching device based on the theory, an automatic positioning device, an automatic carrying method of correcting a carrying route based on the transition quantity calculated, an automatic carrying device and further, an automatic disc-like object manufacturing equipment utilizing these. By the way, the "teaching" mentioned in the present invention means that in a handling device is inputted and memorized the reference position which is a positional co-ordinate in a reference co-ordinate system including the position of a device which handles a place where the disc-like object is situated and is the reference of motions of a holding portion and the like of the handling device which carries out the carrying of the disc-like object and other handlings. Further, the "positioning" in the present invention means that it is determined how far the positions of a disc-like object mounted on an arbitrary position on the holding portion and the like and the holding portion which holds it are deviated from the reference position previously inputted.

Firstly, the principle of the present invention is illustrated. FIG. 4 shows a case that the circumference of a disc and the circular arc shaped locus of one sensor cross. The disc 47 which should be measured forms a circular arc $W_1 W_3 W_2$ if intersections of the above-mentioned circumference having a known radius r with a circular arc detected locus 43 having a known radius R are referred to as $W_1$ and $W_2$ and the apex of the circular arc of the above-mentioned circumference between these intersections is referred to as $W_3$. The perpendicular bisector 42 of the section of a line $W_1$ and $W_2$ which both ends of the circular arc form passes the center A of the measured disc 47 and the center O of the circular arc locus of the sensor. The transition angle α of the perpendicular bisector 42 to the direction 41 preliminarily taught can be determined by measurement Further, an angle θ of the perpendicular bisector 42 to one end $W_1$ of the circular arc can be also determined by measurement.

Then, as the center position of the measured disc 47, the section of a line AO (=$L_1$) whose length is unknown is determined. If a perpendicular is drawn from $W_1$ to the section of a line $W_3O$ of the perpendicular bisector 42 and its intersection is referred to as B, from $\triangle W_1 BO$, $BO = R \cos \theta$, $W_1 B = R \sin \theta$ (Formula 1), from $\triangle W_1 BA$, $BO = r \cos \phi + L_1$, $W_1 B = r \sin \phi$ (Formula 2), namely, $R \cos \theta = r \cos \phi + L_1$ (Formula 3), $R \sin \theta = r \sin \phi$ (Formula 4).

They are transposed and rearranged.

$r \cos \phi = R \cos \theta - L_1$ (Formula 5)

$r \sin \phi = R \sin \theta$ Formula 6)

When (Formula 5) and (Formula 6) are squared and both of left and right sides are respectively added, $\cos^2 \phi + \sin^2 \phi = 1$, $r^2 = (R \cos \theta - L_1)^2 + R^2 \sin^2 \theta$ (Formula 7)

accordingly, $L_1 = R \cos \theta \pm (r^2 - R^2 \sin^2 \theta)^{1/2}$ (Formula 8).

Hereat, as shown in FIG. 4, when the center A of a disc to be measured is situated at the inside of a circle where its detected locus is mounted, against the detection locus 43 of the sensor, $L_1 = R \cos \theta - (r^2 - R^2 \sin^2 \theta)^{1/2}$ (Formula 9).

When it is situated at the outside, $L_1 = R \cos \theta + (r^2 - R^2 \sin^2 \theta)^{1/2}$ (Formula 10).

Hereat, since the center position C of the disc 46 preliminarily taught is known, the section of a line CO is referred to as LO, the transition length to diameter direction $\Delta H = L_1 - L_0$ (Formula 11).

Consequently, the positioning of the disc can be carried out using the fore-mentioned transition angle α and the transition length to diameter direction ΔH according to (Formula 11).

Then, in FIG. 5, a case that the linear detection route 43 of one sensor intersects the circumference of the disc-like object 46 being the reference in a circular arc shape is illustrated. When the intersection of the section of a line EF which both ends of the circular arc of the disc 46 situated at a position preliminarily taught, with the perpendicular bisector is referred to as D, the distance CD (=$X_0$) is cleared because it is preliminarily taught.

Then, in FIG. 5, a case that the detection route 43 of a sensor cuts the circumference of the disc-like object 47 to be measured having a known radius r which is situated at a position A whose center is unknown, in a circular arc shape is described. When both end points of the fore-mentioned circular arc are referred to as $W_1$ and $W_2$, the length of the section of a line $W_1$ and $W_2$ is known by measurement. When the intersection of the perpendicular bisector of the section of a line $W_1$ and $W_2$ with the section of a line $W_1$ and $W_2$ is referred to as B and the unknown distance $AB=X_1$, $\triangle ABW2$ is a rectangular triangle; therefore $$X_1^2 + (BW_2)^2 = r^2 \qquad \text{(Formula 12)}.$$

Hereat, since $BW_2 = W_1W_2/2$, $$X_1 = \pm\{r^2 - (W_1W_2/2)^2\}^{1/2} \qquad \text{(Formula 13)}.$$

Accordingly, the transition quantity to an X direction is calculated as $$\Delta X = X_0 - X_1 \qquad \text{(Formula 14)}.$$

Hereat, since the point D on the detection route 43 is the teaching position, it is known and since the point B is the middle point of the points $W_1$ and $W_2$ of measuring the section of a line, they can be determined by measurement.

Accordingly, the transition quantity to a Y direction of $$\Delta Y = BD \qquad \text{(Formula 15)}$$

is also determined by measurement

Consequently, the transition quantity ($\Delta X$, $\Delta Y$) is calculated.

The inventions of an embodiment relate to methods of teaching a reference position using the fore-mentioned principle. Namely, the present invention proposes a method for automatically teaching a reference position which is the reference of the position of a disc-like object in the reference co-ordinate system including the position of a handling device to the handling device of the fore-mentioned disc-like object, comprising a step of determining the center position of a disc-like object having a known radius which was situated at a fixed place being the reference position in the fore-mentioned reference co-ordinate system and a step of memorizing the position of the fore-mentioned fixed place in the fore-mentioned reference co-ordinate system which was determined by calculation based on the fore-mentioned center position in the fore-mentioned handling device as the reference position, wherein a step of determining the center position of the fore-mentioned disc-like object comprises a step of relatively moving a detection means against the fore-mentioned disc-like object and making one lotus of the fore-mentioned detection means cross against the circumference of the fore-mentioned disc-like object, a step of determining the position of two intersections by the fore-mentioned crossing in the fore-mentioned reference co-ordinate system, and a step of calculating the fore-mentioned center position using the specific point on the perpendicular bisector of the section of a line combining the fore-mentioned two intersections, the fore-mentioned two intersections and the radius of the fore-mentioned disc-like object. Another embodiment relates to a device for realizing the method.

The specific point hereat is defined as a point which is known or measured. Namely, when the locus of the detection means is a circle, the circle is a rotational center and this is known. Further, when the locus of the detection means is a straight line, it is the middle point of the section of a line combining the fore-mentioned circumference with two intersections and determined by measurement immediately. In the present teaching method, when the disc-like object is placed at the fixed place being the reference position, it is preferably carried out by manual operation and then, when a commercially available wafer is used as the disc-like object is used, concave portions such as a notch and an orientation flat is preferably placed so as to be evaded from the detection route. Further, a disc-like object having no concave portion and convex portion other than a wafer may be used. Further, the positions of the concave portions and convex portions may be automatically confirmed by image processing and the like and the concave portions and convex portions may be automatically placed so as to be evaded from the detection route.

Similarly, according to the fore-mentioned principle, when the disc-like object has no concave portion and convex portion, or when these are evaded as described above, a positioning method for a disc-like object according to an embodiment and a positioning device for a disc-like object according to an embodiment using one detection means are proposed. The fore-mentioned detection device and positioning device include all devices such as a known robot, a carrying device and a proprietary positioning device by which the methods of the present invention can be realized as functions, as specific embodiments.

In the present invention, a sensor for detecting the disc-like object may be fixed and the disc-like object may be moved, or the disc-like object may be fixed and the sensor may be moved. Further, the movement may be a linear line movement and may be circular movement.

Further, in the methods according to certain embodiments, it is required to preliminarily teach the center position of the disc-like object, but at that time, the method according to another embodiment may be used and a conventional known method may be used.

[Method 1 for Evading Notched Portion]

The inventions according to an embodiment propose the positioning method and the positioning device when there are the notched portion (concave portion) as the reference place on the peripheral rim of notches, orientation flats or the like as a semiconductor wafer and the convex portion such as a grip installed on a disc.

Namely, hereat, when the center position of the disc-like object is calculated, for example, different detection routes 43 and 44 are provided using the two detection means 9 as shown in FIG. 6. When the detection route 43 passes the notched portion 51 which is a concave portion, the section of a line which is formed by the outer periphery of a disc and two intersections is shortened in comparison with a case that there is no notched portion, and it is calculated that the center of a disc is situated at the rotational center side O by the fore-mentioned calculation method.

It is more specifically illustrated. When both of the detection routes 43 and 44 do not pass the notched portion, it is calculated that both of distances of the center A of a disc and the rotational center O are AO from two triangles at the left side of the perpendicular bisector 42 in like manner as (Formula 16) in FIG. 6.

$$AO = R_1\cos\theta_1 - (r^2 - R_1^2\sin^2\theta_1)^{1/2} \qquad \text{(Formula 16)}$$
$$= R_2\cos\theta_{11} - (r^2 - R_2^2\sin^2\theta_{11})^{1/2}$$

On the other hand, when the detection route 43 passed the notched portion 51, the distance CO between the rotational center and the disc center is shorter by $\Delta L_1$ in comparison with a case that there was no notched portion 51 and it is confirmed as the disc 49 in error.

Namely, it is calculated as $$CO = R_1\cos\theta_1 - (r^2 - R_1^2\sin^2\theta_1)^{1/2} \quad \text{(Formula 17)}$$
$$= AO - \Delta L_1.$$

Accordingly, a larger value is selected comparing the calculation results of (Formula 16) and (Formula 17).

In FIG. 7, when there is the notched portion in the detection route 44, a larger distance AO is similarly selected.

Namely, when the detection route passes on the notched portion, it is calculated that the disc center calculated is situated at the rotational center side O without fail and it is small. Two detection routes are separated so that the notched portion is provided on one of them, the circumference of a disc is cut into two circular arc shapes, both ends are respectively measured, and the disc center which is viewed from the rotational center, namely, the larger value of the distance AO is selected.

By the way, when there is no notched portion on both of the two detection routes 43 and 44, the center position is found at the same place; therefore either may be adopted.

[Method 2 for Evading Notched Portion, Method for Passing Twice by One Sensor]

Then, as shown in FIG. 8 and FIG. 9, in an embodiment, two different circular arcs may be formed by one sensor and twice rotational operations. Namely, when the center of the disc-like object is calculated, it is rotated while the distance R from the rotational center O to the detection route 43 remains as it is, and it is rotated by deviating the center position of the disc-like object by a distance m at the second time. However, it is required that the distance m is expanded at the second rotational movement to an extent that it is not hanged with the notched portion and set as a narrower interval than the diameter of the disc.

Firstly, the detection procedure is illustrated in FIG. 8 with respect to a case that the detection route 43 did not pass the notched portion 51 and a case that it passed the notched portion 51. Firstly, when the detection route 43 did not pass the notched portion 51, the disc is confirmed by the calculation equation (Formula 18) from a triangle having a rotational angle $\theta_1$ which is situated at the left side of the perpendicular bisector 42 and the center is calculated as A.

$$AO = R\cos\theta_1 - (r^2 - R^2\sin^2\theta_1)^{1/2} \quad \text{(Formula 18)}$$

On the other hand, when the detection route 43 passed the notched portion 51, the disc 49 is recognized by recognizing in error that the distance between both ends of the circular arc is short from a triangle having a rotational angle $\theta_2$ which is situated at the right side of the perpendicular bisector 42, and the center of the disc is recognized as C in error.

$$CO = R\cos\theta_2 - (r^2 - R^2\sin^2\theta_2)^{1/2} \quad \text{(Formula 19)}$$

$$AO - CO = \Delta L_1 \quad \text{(Formula 20)}$$

Namely, it is calculated that the center C related to the notched portion approaches by $\Delta L_1$ to the rotational center side O.

Then, as shown in FIG. 9, a case of carrying out the rotational movement at the second time by shifting it by the distance m is mentioned. When the detection route 43 passed the notched portion 51 of the disc 47 at the first rotation, it is recognized in error that the circular arc was lessened, and it is calculated by the similar calculation as Formula 19 that the disc center is situated at C' which approaches to the rotational center side O by $\Delta L_1$ form the original center A'. Then, it is shifted by the distance m to a direction by which the rotational radius is enlarged, and when the detection route 43 is designed so as not to pass the notched portion 51 of the disc 50, it is recognized in error that the disc center is A" from Formula 9.

Accordingly, larger (A"O−m) may be adopted by comparing CO (=A'O−$\Delta L_1$) with A"O−m.

Similarly, even if the notched portion is not found at the first rotational motion and found at the second rotational motion, the larger distance may be selected as the distance between the correct center of the disc and the rotational center.

Then, when there are convex portions not illustrated on the circumference of a disc, it becomes larger without fail as compared with the section of a line which two intersections form in comparison with a case that there was no convex portion. Accordingly, when there are convex portions on the circumference of a disc, it is calculated that the disc center is situated at a far position from the rotational center without fail in comparison with a case that there was no convex portion. Namely, it is better to always select a smaller distance as the correct distance between the disc center and the rotational center among the distances calculated from the two sections of lines by Formula 9 when there are the notched portions. Accordingly, the rotational center by the detection route which is not related with the concave portion and the convex portion can be selected.

When there were no concave portion and no convex portion on the two detection routes, either may be adopted because the center position is found at the same place as the forementioned description.

Further, when the two detection routes 43 and 44 are linear lines in this embodiment, the same can be mentioned, and these are shown in FIG. 10 and FIG. 11. When the detection route passes the notched portion, it is calculated that the disc center calculated is situated at the outer side from the detection route without fail. The detection routes 43 and 44 are separated by a distance m between parallels so that the notched portion does not enter, the circumference of a disc is cut into two circular arcs, respective ends are measured, and the disc center which is situated at inside viewed from the detection route may be selected.

It is more specifically illustrated. In FIG. 10, if there is no notched portion in both of the detection routes 43 and 44, calculations from respective cases are that the center position of the disc-like object is A and $X_{AP}+X_{AB}+m$.

However, when the detection route 44 catches the notched portion, it is recognized in error that the circular arc is small and a circle is 49 and it is calculated that the center is A' in the calculation method of the present invention.

Accordingly, since $X_{AP} < X_{A'Q}$, $X_{AB}+m < X_{A'Q}$ is obtained.

Namely, the center position information according to the detection results for the detection route 43 and the detection route 44 is compared, and the smaller distance $X_{AB}+m$ may be selected as a correct value.

Similarly, a case that the detection route 43 catches the notched portion is shown in FIG. 11. The calculation result for a case that there is no notched portion on the detection route 43 together is $X_{AB} = X_{AP} - m$.

When there is a notched portion on the detection route 43, it is recognized as a circle 49, it is $X_{AB} < X_{A'B'}$, namely $X_{AP} - m < X_{A'B'}$.

Accordingly, the center position information according to the detection results for the detection route 43 and the detection route 44 are compared, and the smaller distance $X_{AP}-m$ may be selected as a correct value. A disc center which is situated at a near position viewed from the detection means is always selected.

Further, this embodiment includes also a case that 2 different circular arcs are formed by one sensor and twice straight line motions. Namely, in FIG. 10 and FIG. 11, when the locus of the detection means 9 draws the detection route 43 at the first motion and the detection route 44 at the second motion or the loci are drawn in its reverse order, the fore-mentioned illustration is applicable as it is.

Then, another embodiment proposes a method of correcting a carrying route from a route preliminarily taught so as not to generate collision and interference at carrying a disc-like object such as a wafer to an objective place from the transition quantity of the center position determined, by applying the principle of the present invention to a device having carrying function, and a carrying device for doing so.

[Method of Determining Wafer Radius r with 3 Detection Routes]

6 Kinds of 3 inches, 4 inches, 5 inches, 6 inches; 8 inches and 300 mm for semiconductor wafers among the disc-like object are specified according to the SEMI specification by International Semiconductor Manufacturing Device Material Associate, and stored in proprietary cassettes for every size. Accordingly, since the radius r of the wafer is grasped at a time at which the cassette was placed, it has been treated as a known value in the fore-mentioned calculation process. However, there are case that it is confirmed what wafer size it is during the carrying step, and specifically, a case that the radius is occasionally required to be measured because of difference of the wafer diameter by makers, unevenness between lots, and the like.

The present invention can correspond to the requirement and also measure and calculate the radius of the disc-like object.

Another embodiment describes a method of positioning the disc-like object based on the calculation result by measuring a disc-like object with an unknown radius and calculating its radius and center position and a device thereof, and a further embodiment describes a carrying device correcting its carrying route based on the calculation result.

Hereat, the principle determining the radius of a disc is illustrated for a case that the circumference of a disc and the rotational routes of 3 sensors crossed, using FIG. 12. A rotational base line 40 is a line preliminarily defined. When the detection route 43 among 3 detection routes 43, 44 and 45 passes a notched portion, the perpendicular sector 42 between the sectors of lines of respective 2 intersections of other detection routes 44 and 45 with the outer peripheral rim of a wafer is common and an angle formed between the rotational base line 40 and it is $\alpha_1$, but in case of the detection route 43, an angle formed between the rotational base line 40 and a perpendicular sector 48 is $\alpha_2$, and it is different from the previous $\alpha_1$. Accordingly, only the detection route 43 in which the angle of the perpendicular sector is different is excluded.

The triangles which are composed of the rotational center O and respective 2 intersections of the detection routes 44 and 45 with the outer peripheral rim of a wafer are equilateral triangle together, and a line 42 forms 4 rectangular triangles. Rotational angles $\theta_1$ and $\theta_2$ are measured angles together, rotational radii $R_1$ and $R_2$ are setting distances together, and L is an unknown figure.

$$r^2 = (R_1 \cos\theta_1 - L)^2 + R_1^2 \sin^2\theta_1 \quad \text{(Formula 21)}$$

$$r^2 = (R_2 \cos\theta_2 - L)^2 + R_2^2 \sin^2\theta_2 \quad \text{(Formula 22)}$$

When the detection routes 44 and 45 are situated at a farther distance than the disc center viewed from the rotational center, $$L = R_1 \cos\theta_1 - (r^2 - R_1^2 \sin^2\theta_1)^{1/2} \quad \text{(Formula 23)}$$

$$L = R_2 \cos\theta_2 - (r^2 - R_2^2 \sin^2\theta_2)^{1/2} \quad \text{(Formula 24)}.$$

When Formula 24 is substituted in Formula 21, $$r^2 = \{R_1 \cos\theta_1 - R_2 \cos\theta_2 + (r^2 - R_2^2 \sin^2\theta_2)^{1/2}\}^2 + R_1^2 \sin^2\theta_1 \quad \text{(Formula 25)}$$

$$\text{Hereat, } S = (r^2 - R_2^2 \sin^2\theta_2)^{1/2} \quad \text{(Formula 26)}$$

When Formula 26 is substituted in Formula 25, $$S^2 = (R_1 \cos\theta_1 - R_2 \cos\theta_2 + S)^2 + R_1^2 \sin^2\theta_1 - R_2^2 \sin^2\theta_2 \quad \text{(Formula 27)}$$

$$S^2 = (R_1 \cos\theta_1 - R_2 \cos\theta_2)^2 + 2(R_1 \cos\theta_1 - R_2 \cos\theta_2)S + S^2 + R_1^2 \sin^2\theta_1 - R_2^2 \sin^2\theta_2 \quad \text{(Formula 28)}.$$

When it is solved with respect to S, $$S = \{R_2^2 \sin^2\theta_2 - R_1^2 \sin^2\theta_1 - (R_1 \cos\theta_1 - R_2 \cos\theta_2)^2\}/2(R_1 \cos\theta_1 - R_2 \cos\theta_2) \quad \text{(Formula 29)}.$$

$$(r^2 - R_2^2 \sin^2\theta_2)^{1/2} = \{R_2^2 \sin^2\theta_2 - R_1^2 \sin^2\theta_1 - (R_1 \cos\theta_1 - R_2 \cos\theta_2)^2\}/2(R_1 \cos\theta_1 - R_2 \cos\theta_2) \quad \text{(Formula 30)}.$$

When both sides are squared, $$r^2 = \{R_2^2 \sin^2\theta_2 - R_1^2 \sin^2\theta_1 - (R_1 \cos\theta_1 - R_2 \cos\theta_2)^2\}^2 / 4(R_1 \cos\theta_1 - R_2 \cos\theta_2)^2 + R_2^2 \sin^2\theta_2 \quad \text{(Formula 31)}.$$

When Formula 31 is substituted in Formula 24, $$L = R_2 \cos\theta_2 - \left[ \frac{\left\{ \frac{R_2^2 \sin^2\theta_2 - R_1^2 \sin^2\theta_1 -}{(R_1\cos\theta_1 - R_2\cos\theta_2)^2} \right\}^2}{4 \frac{(R_1\cos\theta_1 - R_2\cos\theta_2)^2 -}{R_2^2\sin^2\theta_2 + R_2^2\sin^2\theta_2}} \right]^{1/2} \quad \text{(Formula 32)}$$

$$= R_2\cos\theta_2 - \frac{\left\{ \frac{(R_2^2\sin^2\theta_2 - R_1^2\sin^2\theta_1)}{(R_1\cos\theta_1 - R_2\cos\theta_2)^2} - 1 \right\}}{2}.$$

Hereat, since the rotational angles $\theta_1$ and $\theta_2$ are measured angles together, L is determined, and the center A of the disc-like object 47 is determined at a distance L from the rotational canter O on the common perpendicular sector 42.

By the way, since the radius r of the disc-like object with an unknown radius is a positive figure, it is determined by (Formula 33).

$$r = [\{R_2^2 \sin^2\theta_2 - R_1^2 \sin^2\theta_1 - (R_1 \cos\theta_1 - R_2 \cos\theta_2)^2\}^2 / 4(R_1 \cos\theta_1 - R_2 \cos\theta_2)^2 + R_2^2 \sin^2\theta_2]^{1/2} \quad \text{(Formula 33)}.$$

Hereat, a case that 3 detection loci of the detection means are circular arcs was illustrated, but these detection routes may be 3 parallel lines. In that case, when one point of 3 parallel lines or other one arbitrary point is set as a base point in place of the rotational base line 40, the radius and the center position of a disc-like object with an unknown radius can be similarly determined.

The center position of a disc-like object with an unknown radius can be also specified according to the second method of the present invention which detects at least 3 points on a peripheral rim. Since at least 3 points on the peripheral rim of the disc-like object are detected in the second method, the locus of a detection means against a disc-like object is relatively drawn by fixing the detection means to move the disc-like object, or by inversely fixing the disc-like object to move the detection means.

When a one-point detecting type detection means is used, 3 points or more cross with a circle of the peripheral rim of the disc-like object. For example, there are preferably methods of detecting 3 points by one pencil writing such as a method of making a triangle function curve as the locus of the detection means cross with a circle of the peripheral rim of the disc-like object; a method of making the detection means cross against a circle of the peripheral rim of the disc-like object along a multidimensional curve of a quadratic or more (for example, in FIG. 28 and FIG. 29, a sensor as the one-point detecting type detection means is relatively moved against a disc-like object along a secondary curve) and making it intersect; a method of making a peripheral rim cross at 2 points with a straight line as the locus of the detection means, folding it in a V-character type and further detecting 2 points; and a method of making a peripheral rim cross at 2 points with a straight line, folding it in a U-character type and further detecting 2 points, etc. Further, there may be used a method of obtaining 4 intersections against a circle of the peripheral rim by making the locus of one detection means be an ellipse or an oval in which a long diameter is larger than the diameter of the fore-mentioned disc, namely, an O-character type. In summary, 3 points or more are designed to be detected by relatively moving the detection means against a disc-like object.

When 2 or more of the detection means are used, the locus is made the peripheral rim of a disc-like object cross once or more. A key type such as a V-character shape or L-character shape is determined by a combination of 2 straight lines. Further, in order to exclude movement in a sharp angle, a U-character type, a C-character type or an O-character type (ellipse or oval) which is a combination of a circle and the fore-mentioned various curves with a straight line may be good. When 3 to 4 or more of one-point detecting type detection means are used, it may be good that all of the detection means cross only once with the peripheral rim of the disc-like object.

In the present invention, when at least 3 points on the peripheral rim of the disc-like object are detected, the radius of the disc-like object can be calculated by the formula of a circumference without calculating the sequence of a line binding both ends of a circular arc and its perpendicular sector. When the peripheral rim is a real circle, a circle is determined when 3 points are decided, but when there is a notched portion in a semiconductor wafer, at least 4 points are required.

A method of determining a center point (center position) from 3 points on the peripheral rim of the disc-like object with an unknown radius is illustrated using FIG. 30. Provided that, 3 points on the peripheral rim of the disc-like object are points on a real circle which does not catch a notched portion, hereat. A rotational angle from a rotational reference line to an intersection is measured by making the one rotational route 43 of a sensor (for example, an optical sensor having only one pair of a luminescence portion and a light reception portion, and the like) as the one-point detecting type detection means cross with the peripheral rims of the disc-like objects 47 and 50 whose distances from the rotational center to the center position are mutually different. Hereat, for convenience, the zero point of the reference co-ordinate is set as the center of a rotational channel, and the rotational base line is parallel to a horizontal plane and coincides with an X-axis of a plane on which the disc-like object 47 moves. Further, the sensor is situated on the rotational base line (X-axis) before rotational operation of the sensor and the sensor shall move on the rotational channel 43.

The co-ordinate of intersections of the rotational channel 43 with respect to the peripheral rim of the real circular disc-like object with no notched portion are calculated as follow from the rotational angle measured. Intersections of the peripheral rim of the disc-like object 47 with the rotational channel 43 before movement are referred to as $W_4$ and $W_5$, the peripheral rim of the disc-like object 50 which moved by m from the position of the disc-like object 47 to a direction of a rotational original point with the rotational channel 43 are referred to as $W_6$ and $W_7$, and the rotational angles from the rotational base line (X-axis) to the intersections $W_4$, $W_5$, $W_6$ and $W_7$ are referred to as $\theta_4$, $\theta_5$, $\theta_6$ and $\theta_7$. Further, a distance from the rotational center to the sensor is referred to as R.

The co-ordinate $(x_n, y_n)$ of $W_n$ is determined as follow. Provided that n=4, 5, 6 and 7.

$$\begin{pmatrix} x_n \\ y_n \end{pmatrix} = \begin{pmatrix} \cos\theta_n & -\sin\theta_n \\ \sin\theta_n & \cos\theta_n \end{pmatrix} \cdot \begin{pmatrix} R \\ 0 \end{pmatrix},$$

Then, since $W_8$ and $W_9$ moved to $W_6$ and $W_7$ on the peripheral rim of the disc-like object 50 in accordance with the movement of the disc-like object from the position of the disc-like object 47 to the position of the disc-like object 50, the co-ordinate of $W_8$ and $W_9$ is represented below.

Further, $(\theta_6+\theta_7)/2$ is an angle which the rotational base line and a line passing the center point and the rotational center point of the disc-like object 47 forms.

$$\begin{pmatrix} x_8 \\ y_8 \end{pmatrix} = \begin{pmatrix} x_6 \\ y_6 \end{pmatrix} + \begin{pmatrix} m\cos(\theta_6+\theta_7)/2 \\ m\sin(\theta_6+\theta_7)/2 \end{pmatrix}.$$

According to the above-mentioned intersection co-ordinates, the formula determining the co-ordinate $(x_0, y_0)$ of the center position of the disc-like object is as follow.

The circumference of the disc-like object on the reference co-ordinate system is represented as $$r^2 = (x-x_0)^2 + (y-y_0)^2$$

according to the formula of a circumference.

When the coordinates of points $W_4$, $W_5$, $W_7$ and $W_8$ on the disc-like object 50 are substituted, $$r^2 = (x_4-x_0)^2 + (y_4-y_0)^2 \qquad \text{(Formula 41)}$$

$$r^2 = (x_5-x_0)^2 + (y_5-y_0)^2 \qquad \text{(Formula 42)}$$

$$r^2 = (x_8-x_0)^2 + (y_8-y_0)^2 \qquad \text{(Formula 43)}$$

$$r^2 = (x_9-x_0)^2 + (y_9-y_0)^2 \qquad \text{(Formula 44)}.$$

The radius r of and the center co-ordinate $(x_0, y_0)$ of the disc-like object are determined by three Formulae among the above-mentioned Formulae 41 to 44. Hereat, they are represented below using Formulae 41 to 43.

Since the intersections $W_4$, $W_5$ and $W_8$ are situated on the same peripheral rims, the radii are the same. Consequently, $$(x_4-x_0)^2 + (y_4-y_0)^2 = (x_5-x_0)^2 + (y_5-y_0)^2 \qquad \text{(Formula 45)}$$

$$(x_5-x_0)^2 + (y_5-y_0)^2 = (x_8-x_0)^2 + (y_8-y_0)^2 \qquad \text{(Formula 46)}$$

When it is solved with respect to $x_0$ from Formula 45, $$X_0 = \{(2y_0-y_4-y_5)(y_4-y_5)\}/2(x_4-x_5) + (x_4+x_5)/2 \qquad \text{(Formula 47)}$$

When Formula 47 is substituted in Formula 46, $y_0$ is determined.

$$\{(2y_0-y_4-y_5)(y_4-y_5)\}/2(x_4-x_5) + (x_4+x_5)/2 = \\ \{(2y_0-y_5-y_8)(y_5-y_8)\}/2(x_5-x_8) + (x_5+x_8)/2 \qquad \text{(Formula 48)}$$

When this is rearranged, $$y_0 = \{(y_4+y_5)(y_4-y_5)(x_5-x_8)+(y_5+y_8)(y_5-y_8)(x_4-x_5)+ \\ (x_4-x_5)(x_5-x_8)(x_8-x_4)\}/2\{(y_4-y_5)(x_5-x_6)+(y_5-y_6) \\ (x_4-x_5)\}$$ (Formula 49)

$x_0$ is obtained by substituting Formula 49 in Formula 47.

$$X_0 = \{(y_4-y_5)(x_5-x_8)(x_5+x_8)+(y_5-y_8)(x_4-x_5)(x_4+x_5)+ \\ (y_4-y_5)(y_5-y_8)(y_8-y_4)\}/2\{(y_4-y_5)(x_5-x_8)+(y_5-y_8) \\ (x_4-x_5)\}$$ (Formula 50)

Thus, Formula 50 is obtained.

Even if Formula 44 using a point $W_9$ is used in place of either of Formulae 41 to 43, the same $(x_0, y_0)$ is obtained because $W_5$, $W_8$ and $W_9$ are situated on a real circle.

Then, when either of one of intersections catches a notched portion, four intersections are measured. Among 4 points, there are 4 kinds for a combination consisting of a pair of 3 points, and there is only one kind for the combination including no notched portion. Consequently, when the radius r is determined from $(x_0, y_0)$ which was determined as described above and Formulae 41 to 44, r for a case of only one having no notched portion is a value different from r in case that there are 3 kinds having a notched portion. Since there is no way selecting one kind having no notched portion, a processing for measuring 4 points by changing the position of a locus against the disc-like object and calculating them again is repeated until all values r coincide when all values r at a combination of 4 kinds do not coincide, and then a radius r having a correct value is determined.

Further, the center points of the disc-like object which were determined from a combination of 3 Formulae among Formulae 41 to 44 without determining the value r are directly compared, and when they coincide, they are adopted as the center point having a correct value and when they do not coincide, they may be measured again.

Another embodiment relates to a novel method of using a one-point detecting type sensor and a device thereof among an automatic teaching method, an automatic positioning method, an automatic teaching device and an automatic positioning device which applied the fore-mentioned principle.

Another embodiment relates to a novel method in which a sensor locus is a circular route and a device thereof among an automatic teaching method, an automatic positioning method, an automatic teaching device and an automatic positioning device which applied the fore-mentioned principle. The sensor may move on the circular route and the disc-like object may move in rotation.

Further, the present invention provides an automatic manufacturing equipment of semiconductors and the like in an embodiment by using any one of, or a plural number of the fore-mentioned automatic teaching devices, automatic positioning devices and automatic carrying devices.

The present invention can be realized in not only a positioning proprietary device, but also a carrying device. Further, the automatic carrying device mentioned here includes carrying devices having a rotational movement mechanism and/or straight line movement mechanism, for example, known devices such as a scalar type robot, a multi-joint robot and an XY-axis transfer table.

As the kind of the sensor detecting 2 points on the outer peripheral rim of the fore-mentioned disc-like object, a non-contact type sensor is preferably used. Since it treats often semiconductor wafers which are electronic parts, not an electromagnetic sensor and a mechanical sensor but a permeable type or reflective type optical sensor is preferable. Among them, it may be a two dimensional sensor such as a CCD accompanied with an image processing means, a line sensor by which luminous quantity is quantified, and a point sensor grasping ON and OFF. In order to realize the present invention by the optical sensor, one-point detecting type detection is adequate in minimum, but two sensors may be used for detecting a notch and an orientation flat as mentioned above. As the sensor measuring a transition angle, a known angle sensor such as an encoder may be used, but pulse values as an angle may be adopted by a pulse motor such as a servo motor or a stepping motor.

The above-mentioned respective calculation formulae which were described in the present invention can be easily calculated by a calculation means composing of a computer for controlling the carrying robot of a carrying device and the like according to a usual computer program, and the calculation result can be easily reflected to the movement route of each portion of the carrying devices if it is applied to the controlling means which is composed of a computer for controlling the carrying robot and the like of a carrying device.

Further, the reference coordinate system in the present invention may be not only a rectangular co-ordinate system but also a polar co-ordinate system, and may be a system directly representing a position in the co-ordinate system by a co-ordinate value but also a system indirectly representing it by the operational quantity of respective axes of a carrying robot and the like.

DETAILED DESCRIPTION OF EMBODIMENTS

Modes of Operation of the Invention

Examples of the methods of positioning a disc-like object with respect to the semiconductor manufacturing equipment related to the present invention are illustrated below based on drawings.

Figure 1:
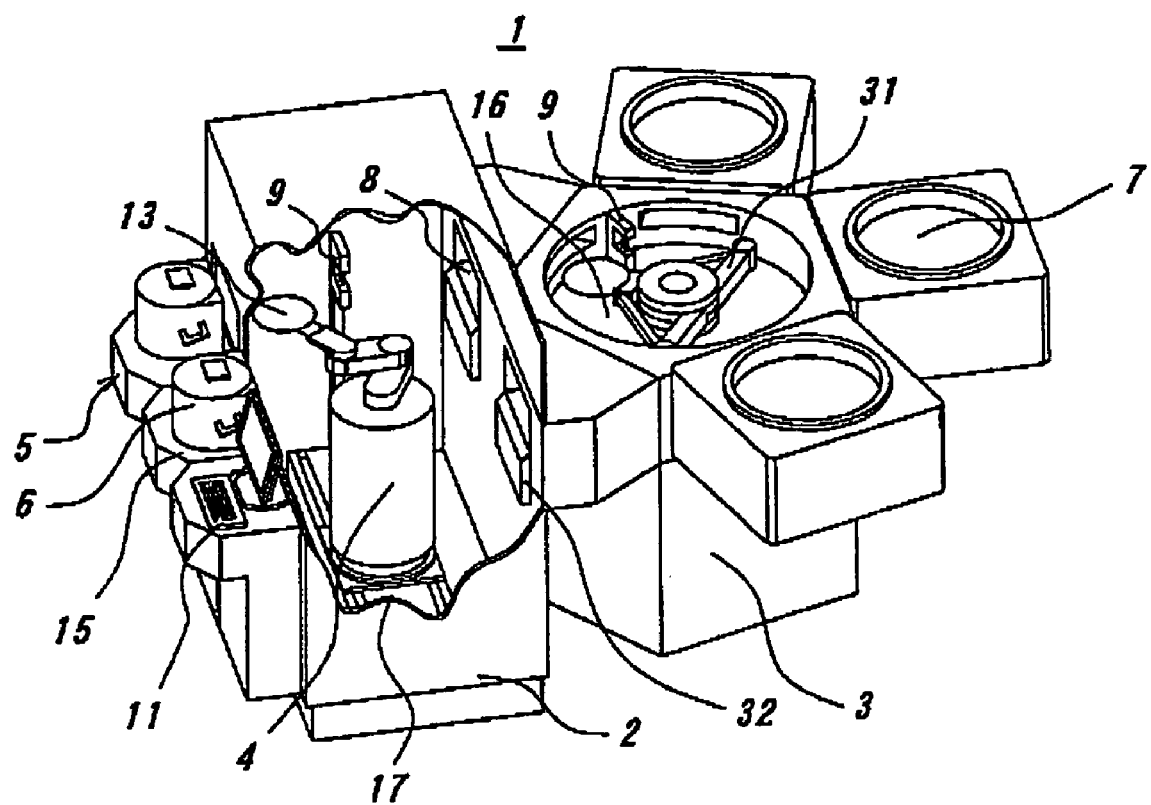
FIG. 1 is a partially notched cross-eyed view illustrating one Example of semiconductor manufacturing equipment for carrying out the present invention.
Figure 25:
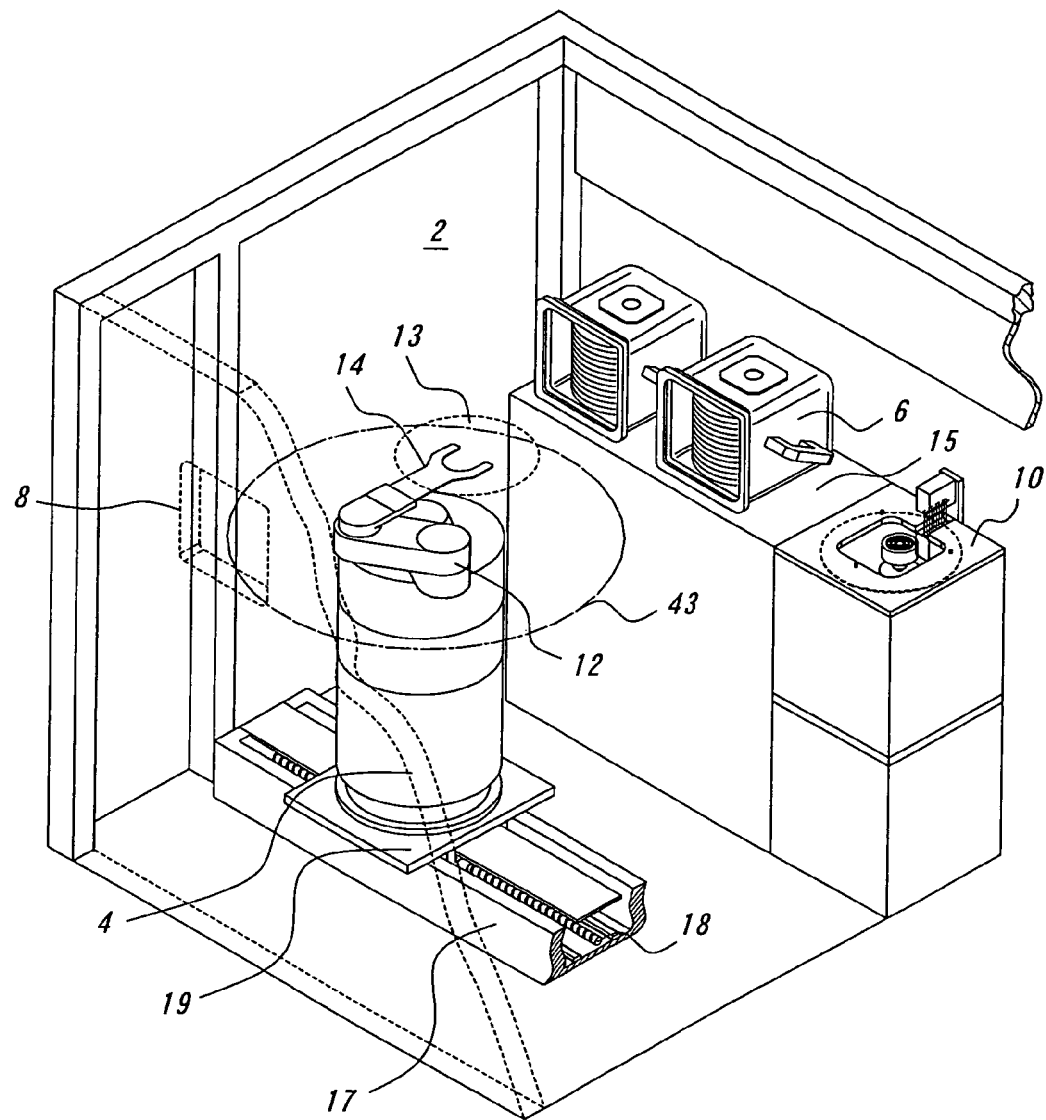
FIG. 25 is a partially notched cross-eyed view illustrating a conventional carrying device.

The semiconductor manufacturing equipment 1 shown in FIG. 1 is equipped with a carrying device 2 which carries a wafer 13 being the disc-like object from a cassette 6 to load lock chambers 8 and the like and a processing device 3 which is connected with the load lock chambers 8 and carries out various processing such as film forming, diffusion and etching for the wafer 13. The carrying device 2 among them is composed of being equipped with one or a plural number of stages 19 which mount a cassette 6 in which wafers are stored in a shelf shape, a scalar type carrying robot 4 having a carrying arm 12, a transfer means 17 which moves the carrying robot 4 in parallel to the row in front of a plural number of stages arranged, a sensor 9 as the detection means, and a control portion 11 having a normal computer which controls the operation of those carrying robot 4, a transfer means 17 and a sensor 9. Further, a conventional positioning device 10 shown in FIG. 25 can be included in the composition of the carrying device 2 for carrying out the correct positional correction of a disc-like object and detecting a notched portion such as the notch of the rim portion of a wafer, and the like.

Similarly, the processing device 3 shown in FIG. 1 is composed of being equipped with one or a plural number of chambers 7 which carry out various processing such as resist coating, exposure and etching, a transfer mounting chamber 16 which links the fore-mentioned chambers 7 mutually, a vacuum robot 31 which is provided in the transfer mounting chamber 16 and carries the disc-like object, the sensor 9 which is the detection means, the load lock chambers 8 which delivers the disc-like object carried by the scalar type carrying robot 4 of the carrying device 2, and the control portion 11 which is used with the carrying device 2 and controls the operation of the chamber 7, the vacuum robot 31, the sensor 9 and the doors described later of the load lock chambers 8.

Further, pockets not illustrated for mounting a plural number of disc-like objects on a shelf are provided in the load lock chambers 8. Further, load lock doors 32 are provided at the inlet and outlet of carrying for making the load lock chambers 8 be a vacuum condition.

[Reference Position Teaching Method (1)]

Firstly, an original co-ordinate which illustrates the positional relation between the holding position and the disc-like object is taught before carrying out teaching in respective ports such as the respective cassettes, the respective load lock chambers 8 and the respective processing chambers.

Figure 2:
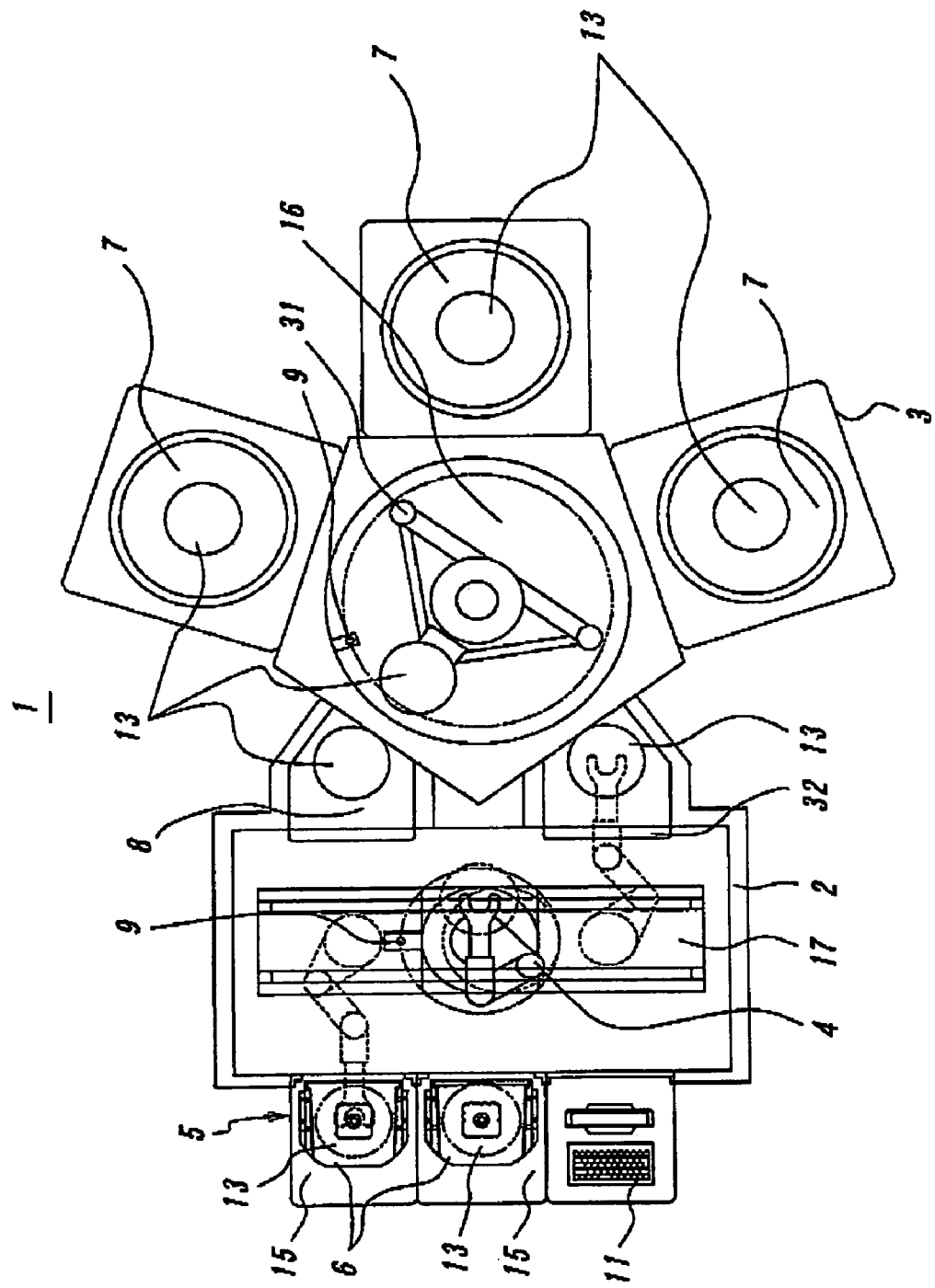
FIG. 2 is a plane view illustrating the semiconductor manufacturing equipment of the above-mentioned Example.
Figure 13:
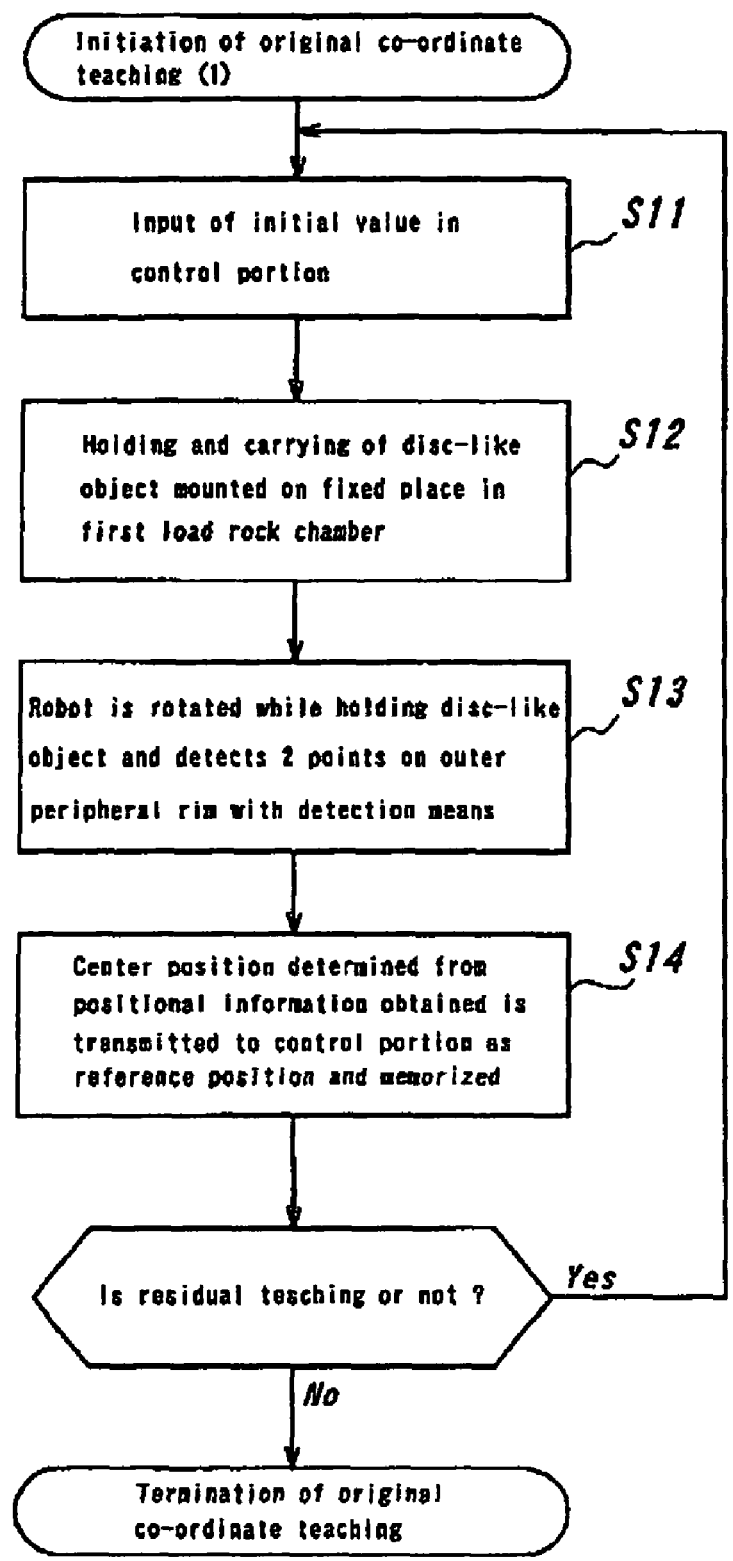
FIG. 13 is a flow chart illustrating the teaching procedure to a carrying device using one Example of the teaching method of the present invention.

In order to automatically carry the wafer 13 in the semiconductor manufacturing equipment 1 of FIG. 2, after the reference position being the original co-ordinate on the reference co-ordinate system including at least one of the positions of the carrying robot 4 and the vacuum robot 31 is previously taught to the control portion of the carrying device 2 and the processing device 3, it is required to teach the carrying route. Since the position before the teaching is usually designed including a margin, the details are required to be matched at the spot. One Example of the reference position teaching method of the present invention is shown in FIG. 13 in case of using one load lock chamber 8.

Firstly, at the step S11, the temporary positional information (initial value) of the first load lock chamber 8 in the above-mentioned reference co-ordinate system on designing before teaching is inputted in the control portion 11. Then, at the step S12, the holding portion 14 of the carrying robot 4 is introduced through the load lock door 32, and a wafer or a disc-like object with the same diameter consisting of other board (hereat, shown by the same code as the wafer) which was manually placed at a fixed place being the reference position in the first load lock chamber 8 is held by the holding portion 14 to be carried out.

Then, at the step S13, the holding portion 14 carries the disc-like object 13 to the sensor 9 as the detection means and is rotated centering the body axis of the robot 4, and the outer peripheral rim portion of the disc-like object 13 is cut in a circular arc with light of the sensor, 9 and the position against the holding portion 14 of 2 points of intersections of the outer peripheral rim portion of the disc-like object 13 with the sensor light, or the position in the above-mentioned reference co-ordinate system is detected. Then, at the step S14, it was determined from the positional information of 2 points on the outer peripheral rim according to the formulae previously described. The center position of the disc-like object 13 at the above-mentioned fixed place is transmitted as the reference position to a carrying robot operation controlling program which the control portion 11 has, the temporary positional information which was inputted at the step S11 is rewritten and the original co-ordinate teaching work is terminated.

By the way, the control portion 11 itself carries out these steps S11 to S14 by the program which was preliminarily provided to the control portion 11.

Similarly, the teaching is respectively carried out for the respective ports such as other load lock chambers 8 using the vacuum robot 31. Namely, in the present invention, all can be automatically taught (automatic teaching) except that the disc-like object such as a wafer is manually placed on a fixed place being the reference position concerning respective ports at first. At that time, it is unnecessary that the holding center of the holding portion 14 coincides completely with the center of the disc-like object 13 as a conventional teaching when the holding portion 14 holds the disc-like object 13. It may be deviated a little when the arm of the carrying robot 4 does not interfere with the load lock door 32 and other instruments.

[Reference Position Teaching Method (2)]

Figure 3:
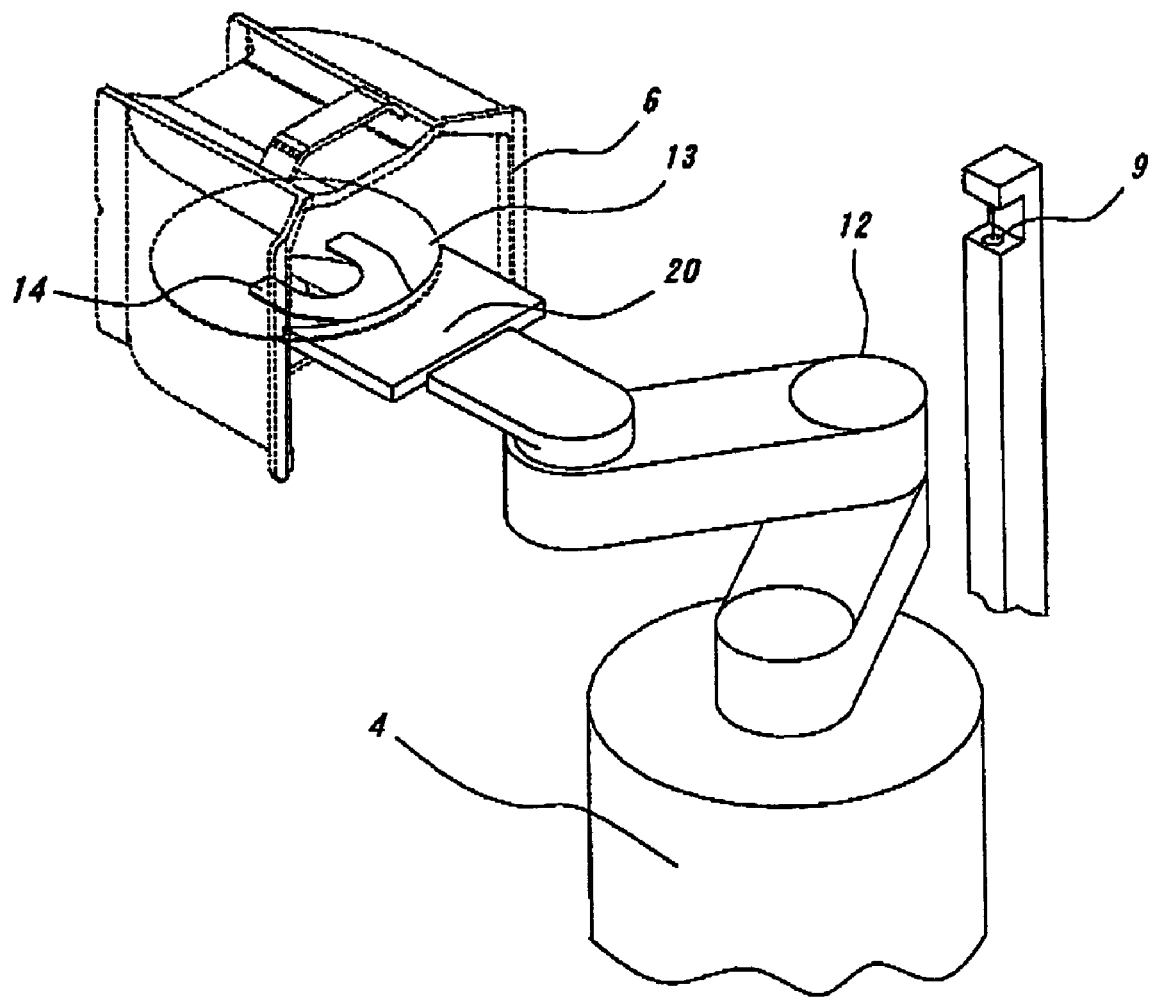
FIG. 3 is a partially notched cross-eyed view illustrating a carrying robot in the semiconductor manufacturing equipment of the above-mentioned Example.
Figure 4:
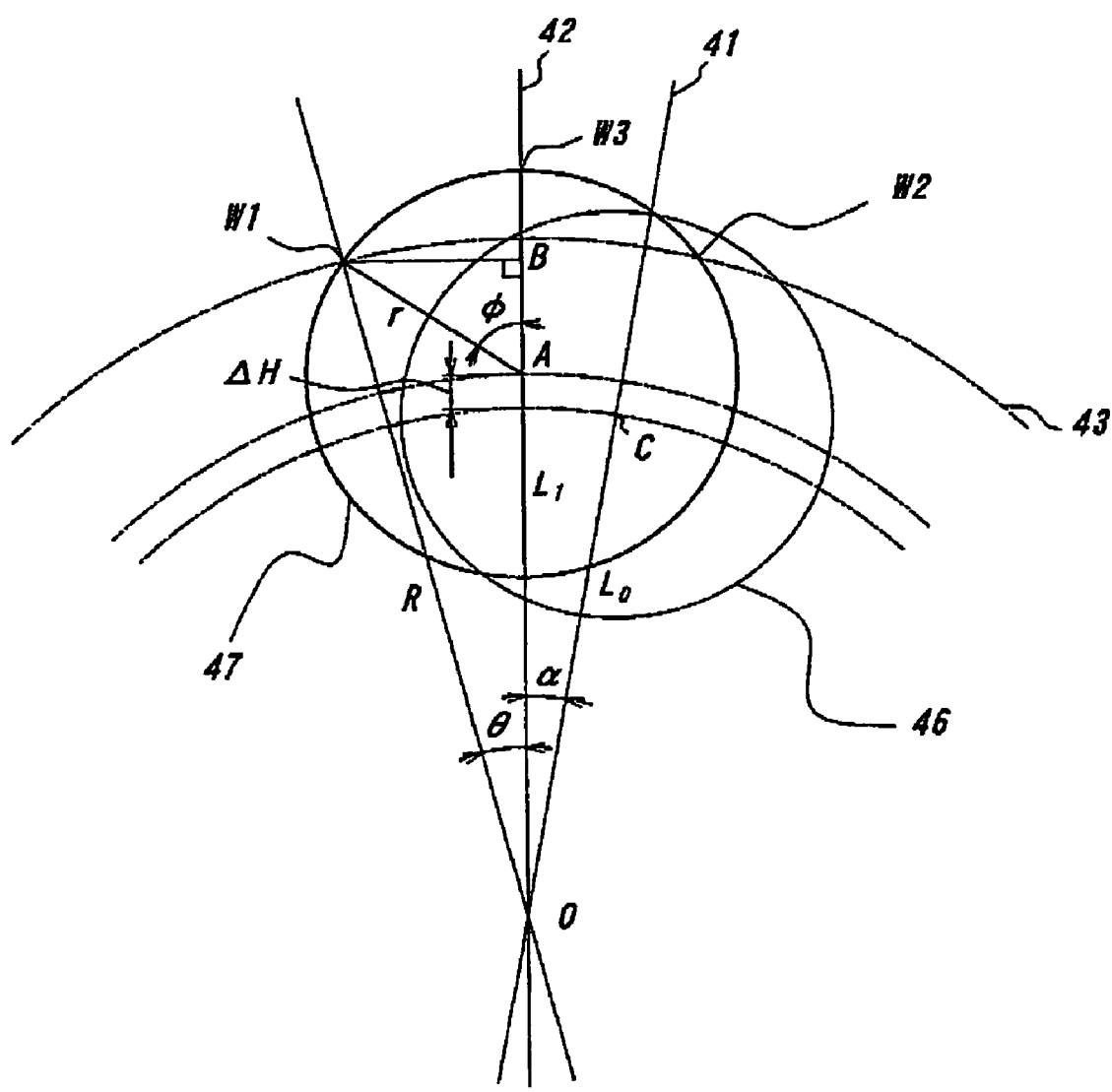
FIG. 4 is a plane view illustrating the principle of the method of the present invention.
Figure 5:
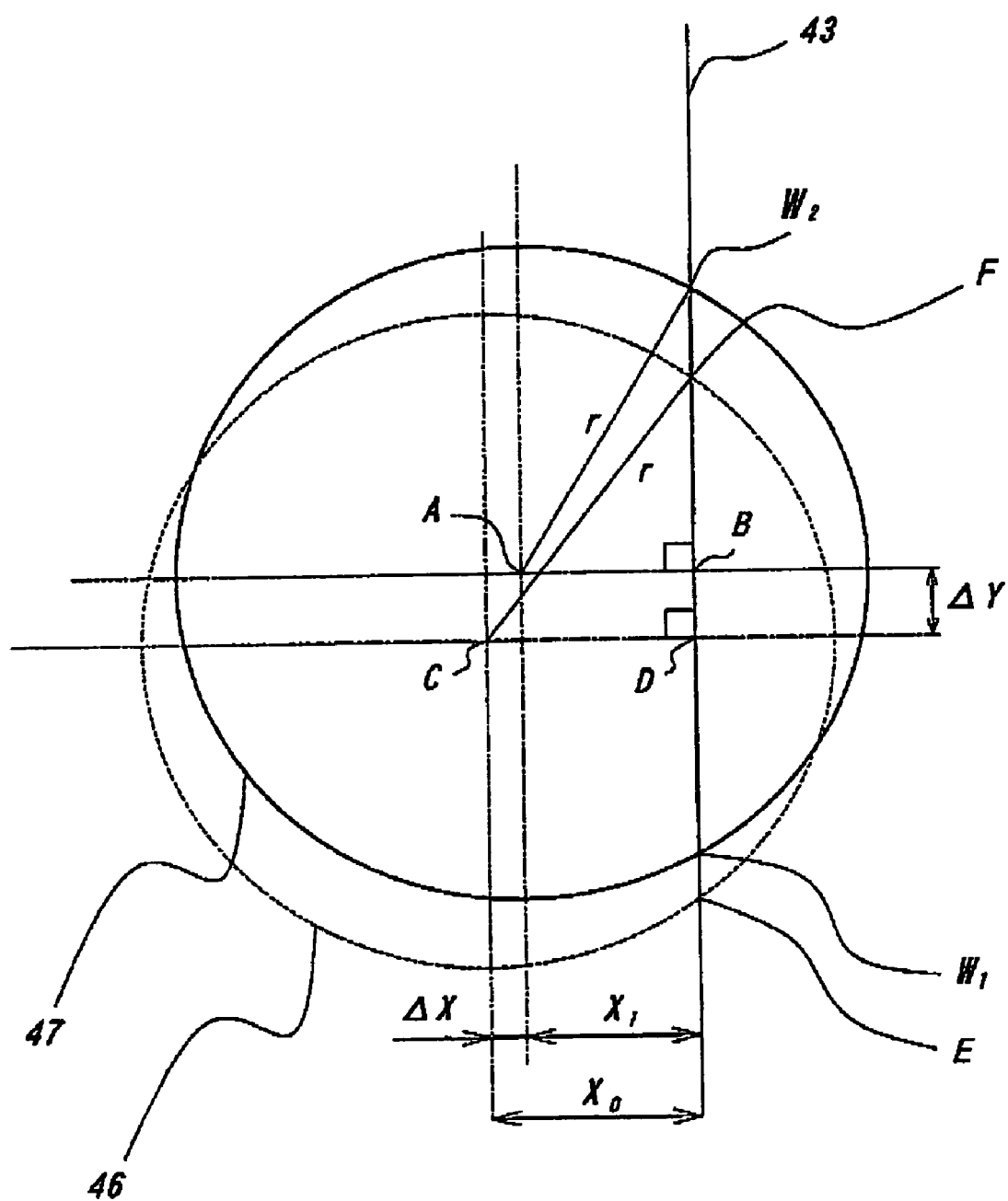
FIG. 5 is another plane view illustrating the principle of the method of the present invention.
Figure 6:
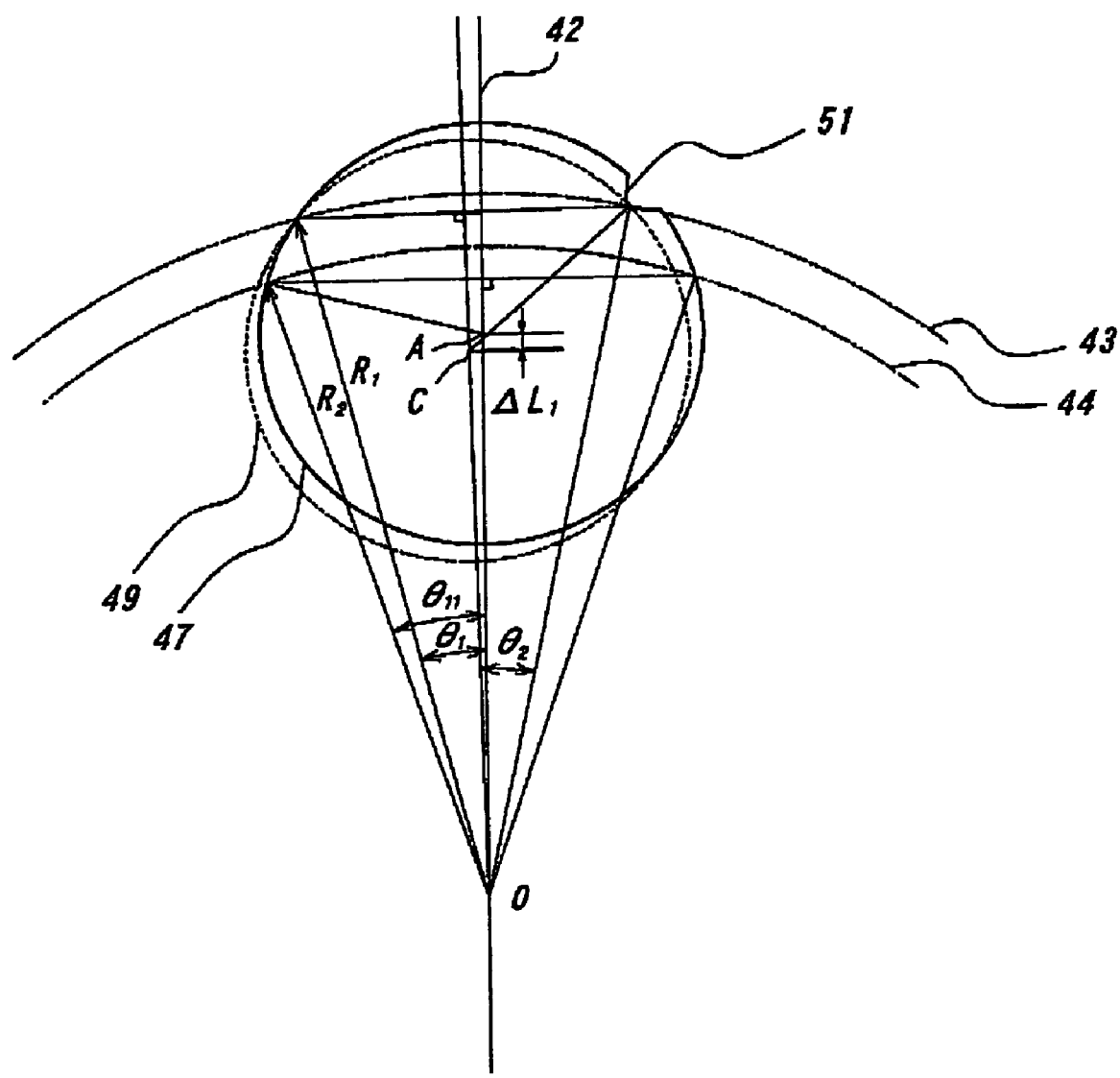
FIG. 6 is a plane view illustrating the principle of detecting a notched portion according to two detection means of the method of the present invention.
Figure 7:
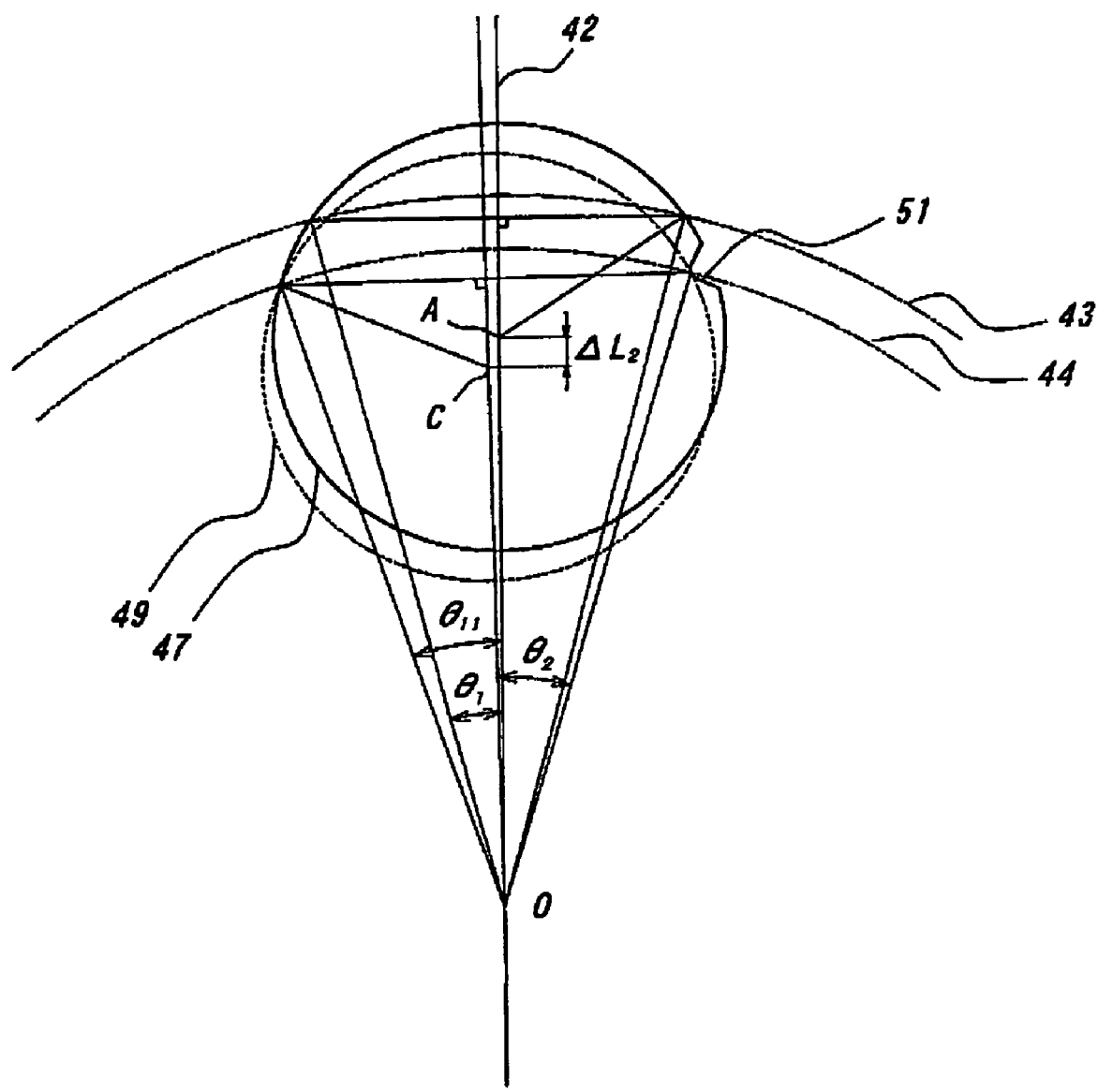
FIG. 7 is another plane view illustrating the principle of detecting a notched portion according to two detection means of the method of the present invention.
Figure 8:
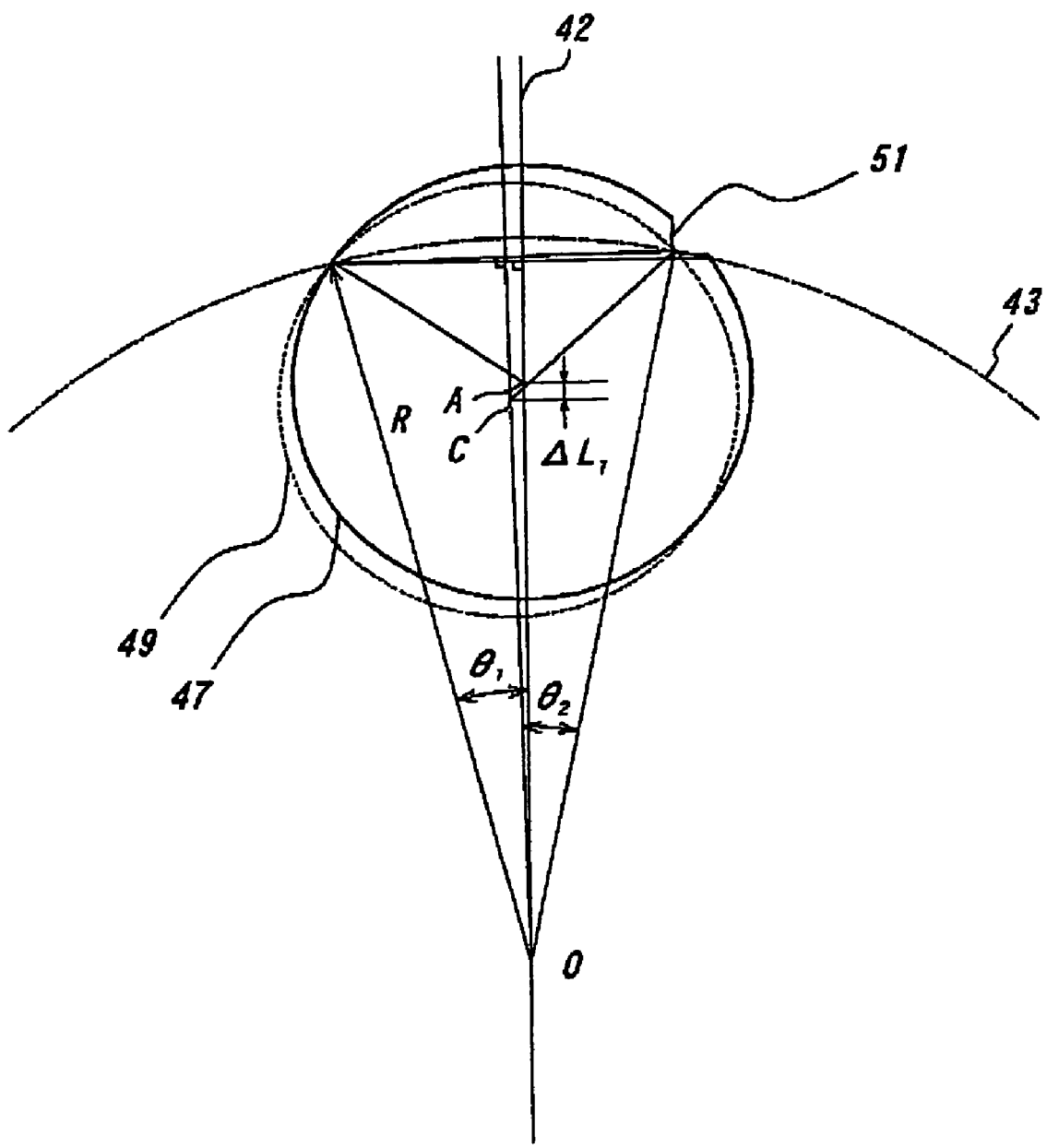
FIG. 8 is a plane view illustrating the principle of detecting a notched portion according to one detection means of the method of the present invention.
Figure 9:
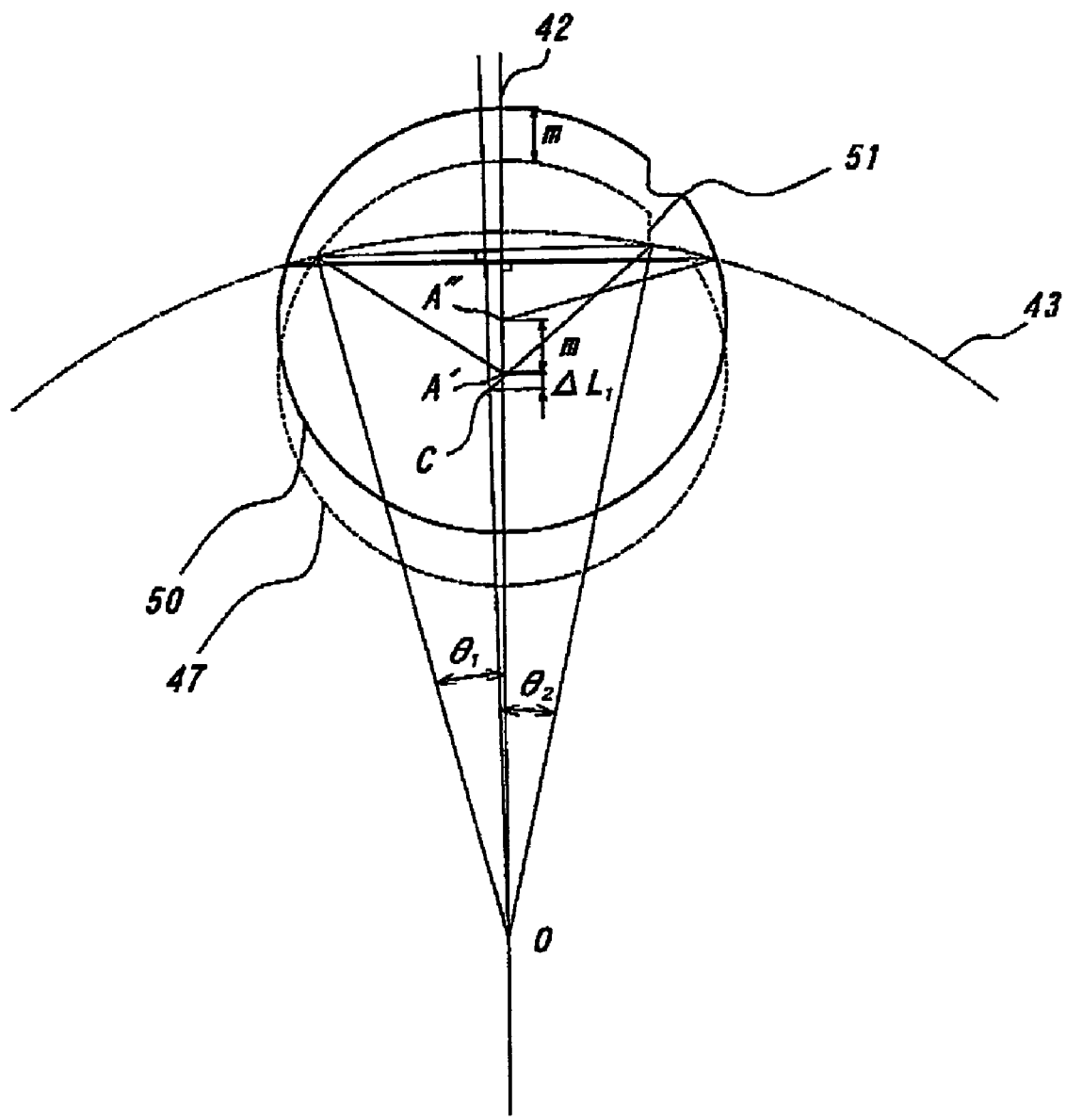
FIG. 9 is another plane view illustrating the principle of detecting a notched portion according to one detection means of the method of the present invention.
Figure 14:
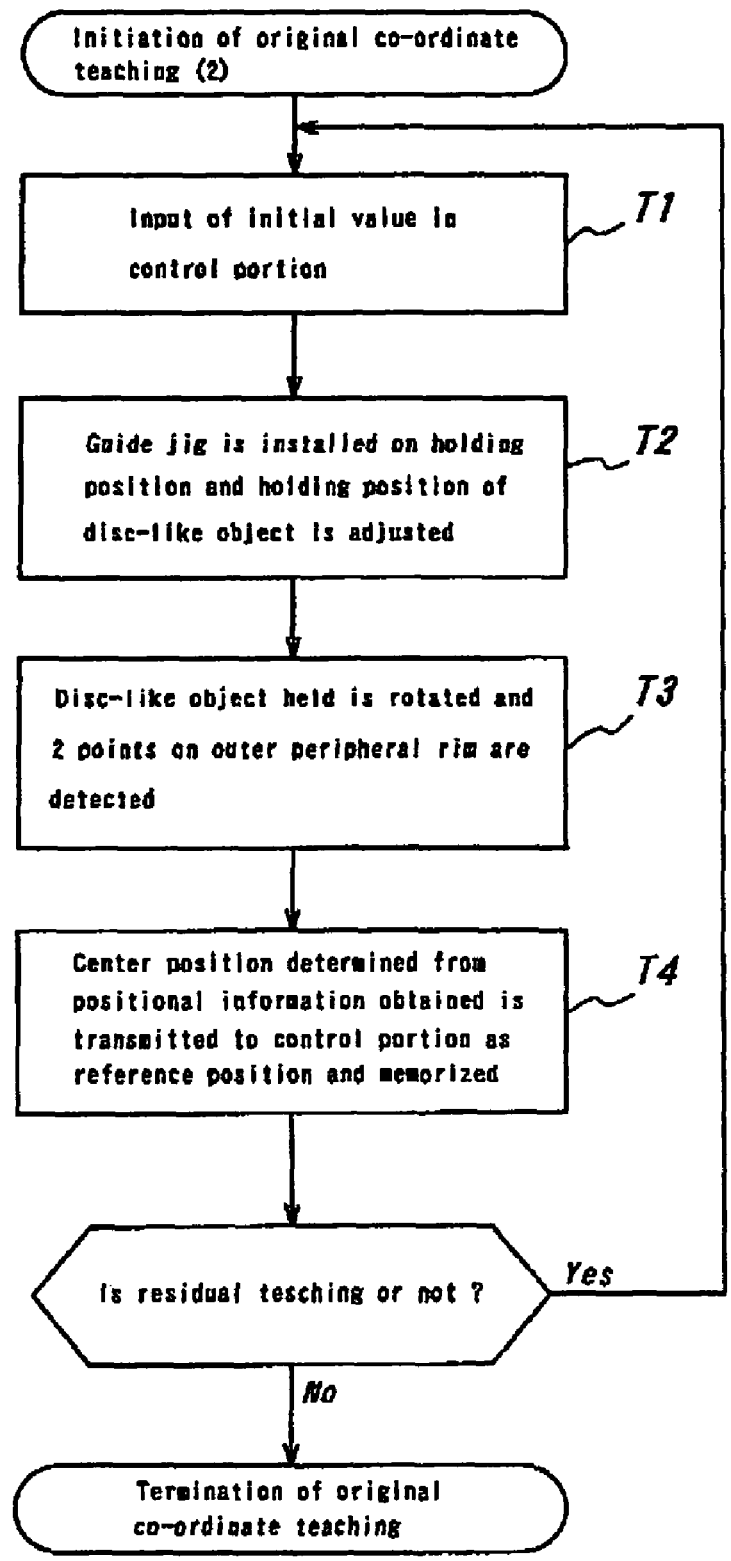
FIG. 14 is a flow chart illustrating the teaching procedure to a carrying device using one Example of the teaching method of the present invention.

In other Example of the reference position teaching method of the present invention, a conventional guide jig may be used. It is a method by which the holding portion 14 is transferred to an appropriate position where a person works easily, a guide jig 20 shown in FIG. 3 is provided on the holding portion 14, the disc-like object is mounted on the holding portion 14 and pushed on the guide jig 20 with a hand, and the center position of the disc-like object at that time is the reference position. The guide jig 20 fixes the position of the wafer physically with a curved surface coinciding with the wafer and the reference plane of a plane consisting of the holding portion 14. FIG. 14 shows a flow chart of the processing procedure when the automatic teaching is carried out in the device of FIG. 3. In the processing, a positional relation between the holding portion and the disc-like object is firstly taught as the reference position before carrying out the teaching to respective ports such as the respective cassettes and the respective load lock chambers.

Firstly, at the step T1, the temporary positional information (initial value) of the disc-like object against the holding portion 14 is inputted in the control portion 11. Then, at the step T2, the guide jig 20 and the disc-like object 13 are mounted on the holding portion 14 in a manual work and they are manually adjusted so that the center position of the disc-like object comes to an appropriate position.

Then, at the step T3, the disc-like object 13 is rotated to the sensor 9 as the detection means, and the position against the holding portion 14 of 2 points of intersections of the outer peripheral rim portion of the disc-like object 13 with the sensor light, or the position in the above-mentioned reference co-ordinate system is detected. Then, at the step T4, the center position of the disc-like object 13 on the holding portion 14 which was determined from the positional information according to the formulae previously described is transmitted as the reference position on the holding portion 14 to a carrying robot operation controlling program which the control portion 11 has, and memorized in the control portion 11.

By the way, the control portion 11 itself carries out these steps T1 to T4 except the step T2, by the program which was preliminarily provided to the control portion 11.

[Other Port Teaching Method]

The procedure of teaching (including the positioning and route correction) in case that the disc-like object is carried out from a cassette by the automatic teaching based on the reference position which was determined as described above is shown in the flow chart of FIG. 15.

Firstly, at the step U1, the carrying temporary positional information (initial value) and the reference positional information are inputted in the control portion 11. Then, at the step U2, the cassette 6 and the disc-like object 13 are mounted on a designed position in a manual work.

Then, at the step U3, the carrying robot 4 receives the disc-like object 13 from a delivery place in the cassette 6.

Then, at the step U4, the carrying robot 4 transfers the disc-like object 13 to the sensor 9 to be rotated and 2 points on the outer peripheral rim are detected in like manner as the above-description.

Then, at the step U5, the information (measurement value) obtained in the step T4 is transmitted to a transition quantity calculating means. Then at the step T6, the measurement value is compared with the reference position to calculate transition quantity. Then, at the step U7, when there is a deviation, the transition quantity is transmitted to a carrying robot operation controlling program which the control portion 11 has.

By the way, the control portion 11 itself becomes a transition quantity calculating means and the like and carries out these steps U1 to U7 except the step U2, by the program which was preliminarily provided to the control portion 11.

Then, at the step U8, the control portion 11 corrects the locus of the carrying robot 4 considering the above-mentioned transition quantity. Namely, the initial value which is a carrying position on a designed drawing is renewed. When there is no deviation, a series of the teaching is terminated.

Figure 15:
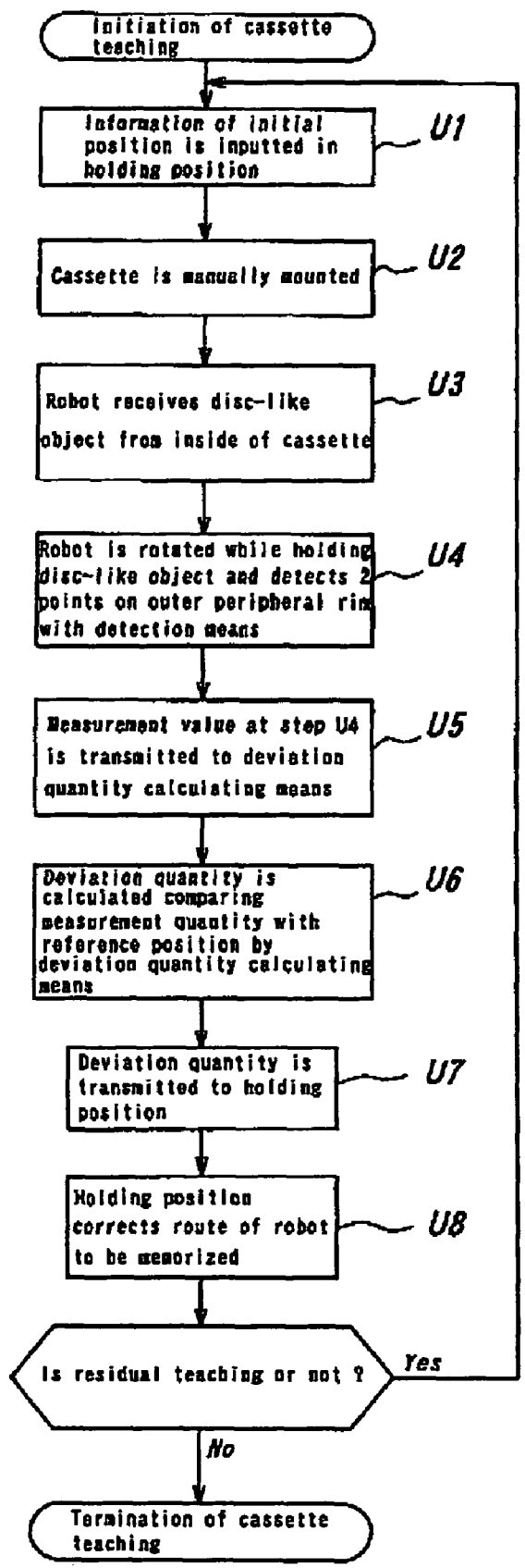
FIG. 15 is a flow chart illustrating the teaching procedure of other port to a carrying device using one Example of the positioning method of the present invention.

Similarly, each of the delivery places with respective ports such as other cassettes 6 and the respective load lock chambers 8 is also carried out according to the procedures of the step U1 to U8 of FIG. 15. All steps except the step of mounting the disc-like object in a manual work to a position on a designed drawing in the step U2 came to be able to be automatically carried out.

Figure 26:
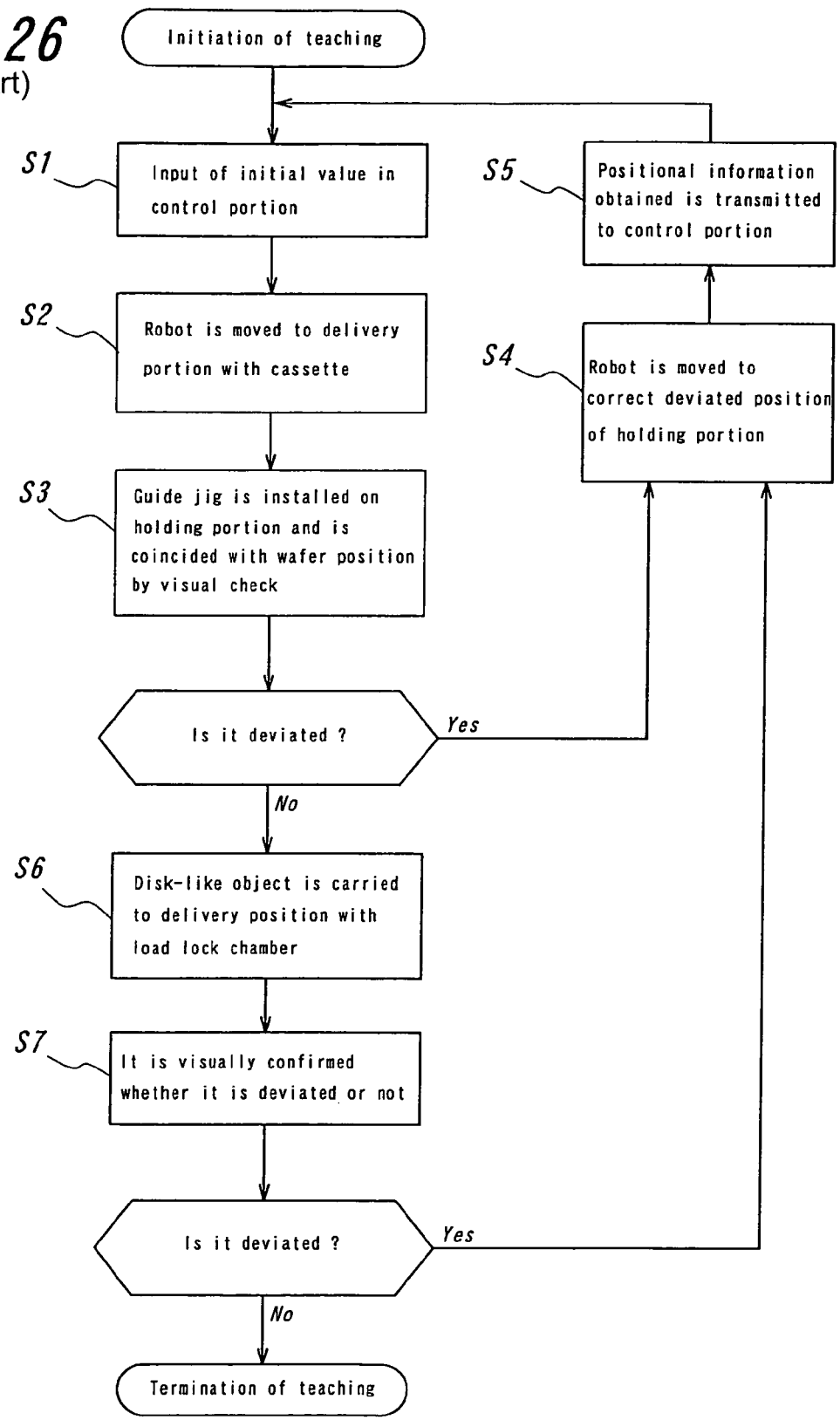
FIG. 26 is a flow chart illustrating the teaching procedure in a conventional carrying device.
Figure 27:
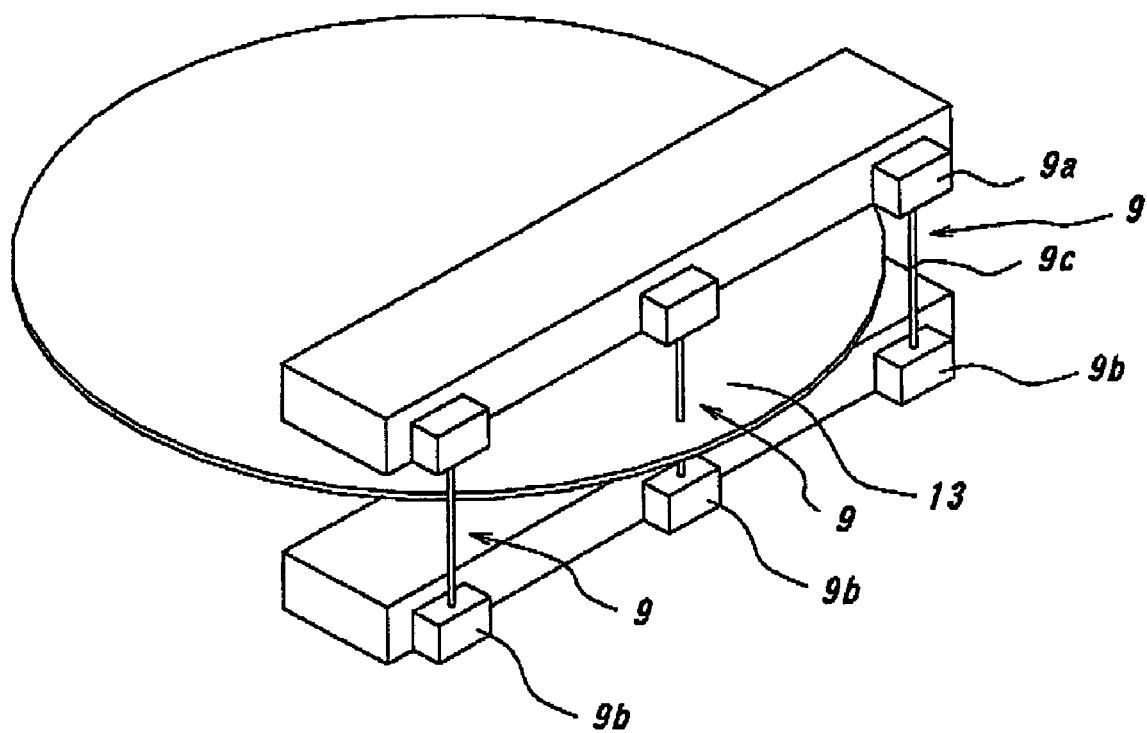
FIG. 27 is a cross-eyed view illustrating an example of a conventional positioning device.
Figure 28:
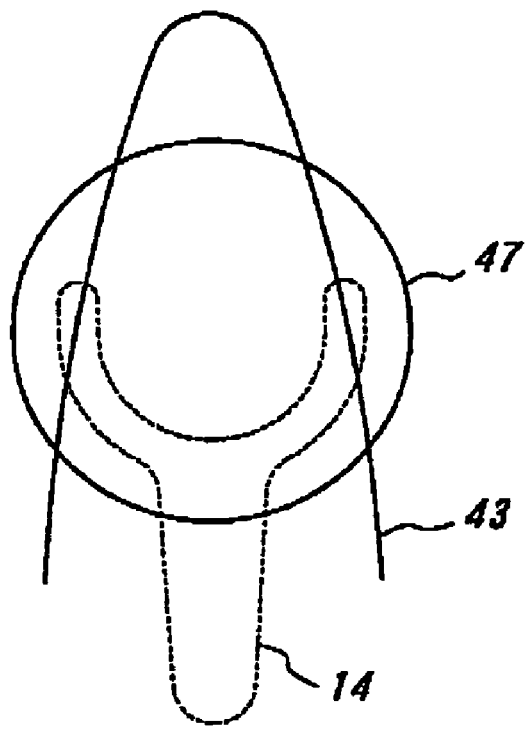
FIG. 28 is a plane view illustrating one example of the detection method of the peripheral rim of a disc-like object by one sensor of the method and device of the present invention.
Figure 29:
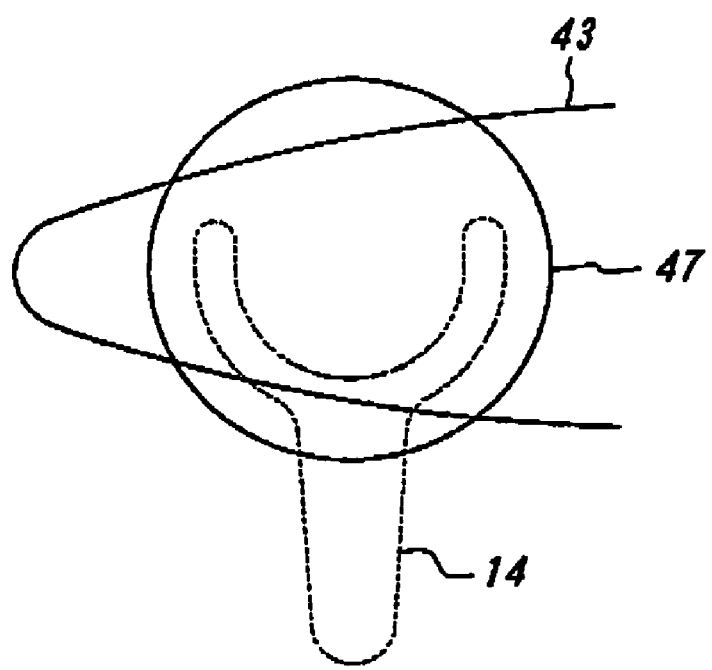
FIG. 29 is a plane view illustrating other one example of the detection method of the peripheral rim of a disc-like object by one sensor of the method and device of the present invention.
Figure 30:
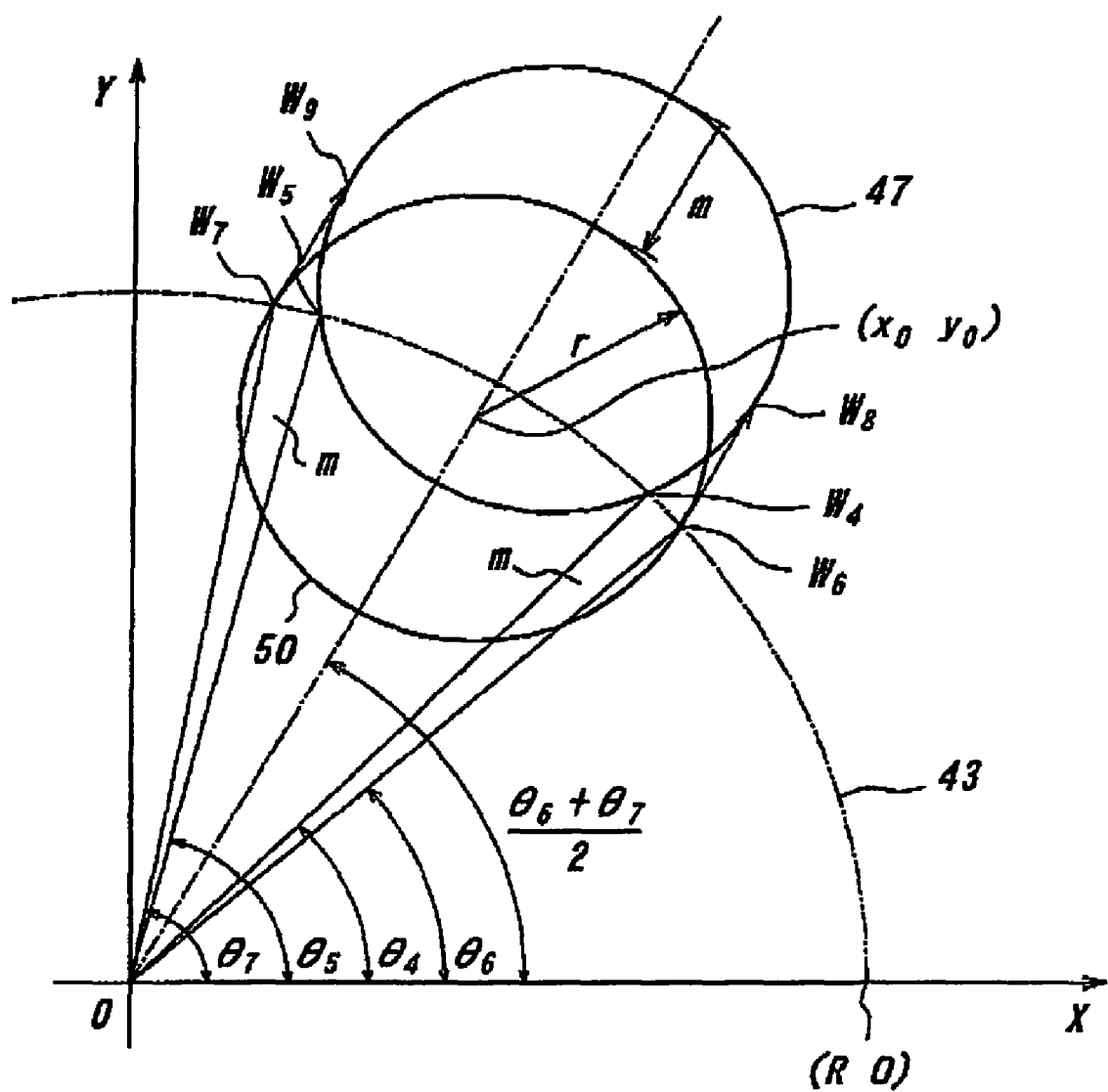
FIG. 30 is a plane view illustrating a method of determining a center point from at least 3 points on the peripheral rim of a disc-like object by the method and device of the present invention.

Further, when the position of the cassette 6 and the like are moved at maintenance, all of the troublesome steps of S1 to S7 of FIG. 26 have been conventionally carried out again manually, but in the automatic teaching based on the present invention, after only the step U2 of FIG. 15 is manually carried out, the residual steps proceed automatically. Further, when the holding portion 14 was replaced, the teaching of the reference position is carried out again from the step U1, new information is compared with old information and the transition quantity shall be reflected to respective measurement values. Thereby, the carrying position to the load lock chambers 8 becomes always constant, interference nearby respective processing chambers 7 is extinguished and dusts are also reduced.

Figure 16:
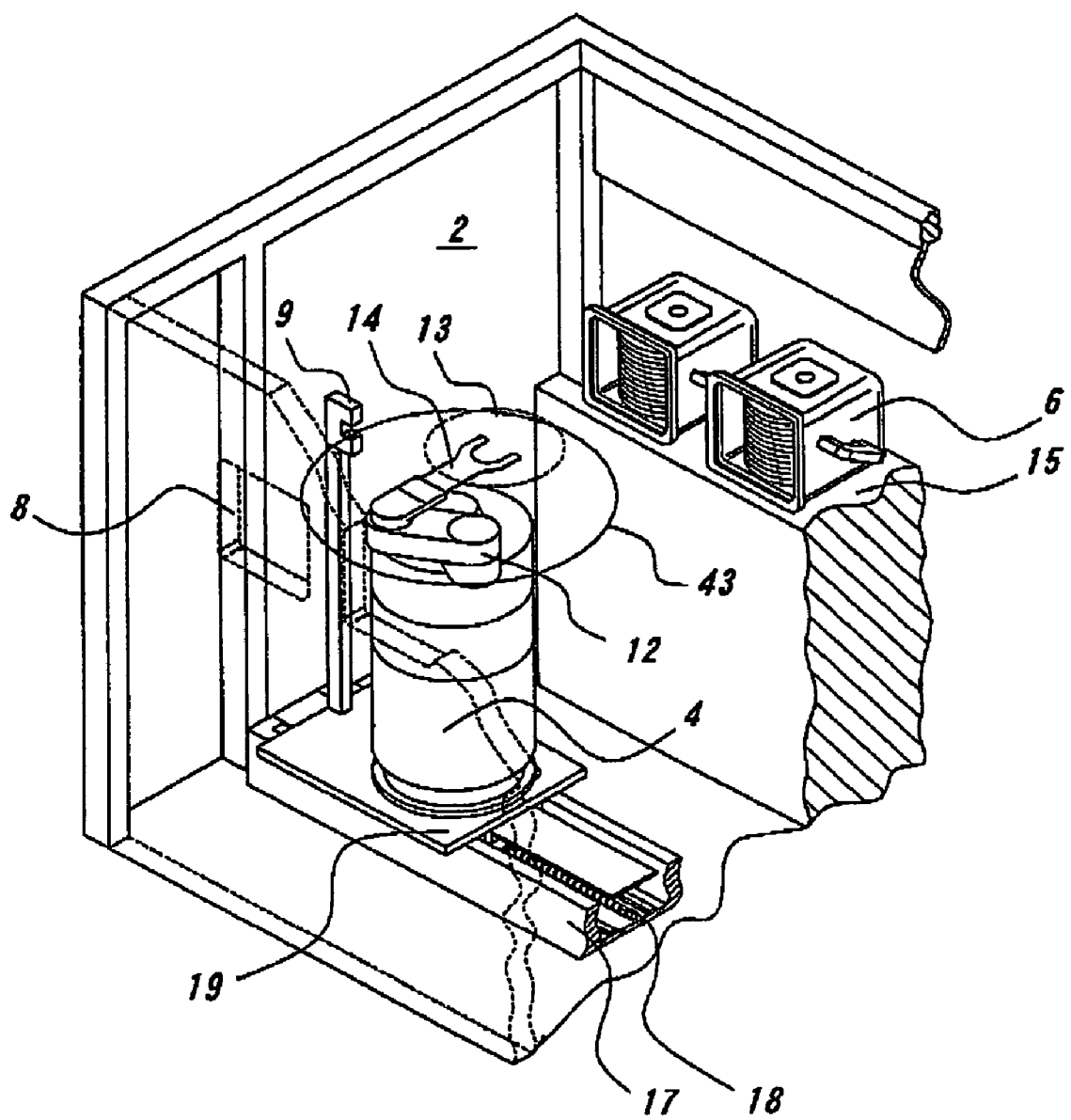
FIG. 16 is a partially notched cross-eyed view illustrating one Example of a carrying device for carrying out the present invention.

FIG. 16 shows the carrying device 2 equipped with the carrying robot 4 and the optical point sensor 9 which is the detection means, as one Example of the positioning device of a disc-like object of the present invention. The driving means of operating the carrying arm 12 of the carrying robot 4 has a reference point previously set, and the transition quantity is determined by measuring the output signals of the optical sensor 9 and the pulses of a stepping motor of the above-mentioned driving means and calculating them. When the carrying arm 12 starts up, it is confirmed by the control portion 11 that all axes of the carrying robot 4 are situated at the reference point, and the respective axes of the carrying robot 4 are bent and stretched, ascended and descended and rotated at the sensor 9 to carry out the positioning of the wafer 13.

FIG. 16 illustrates one Example of the positioning method of the present invention by which the reference position of a wafer 13 is preliminarily taught. The carrying robot 4 which mounted the wafer 13 on the holding portion 14 of the carrying arm 12 from the cassette 6 and carried it is rotated centering the rotational axis of its body, passes the wafer 13 Aly* between a Aly*═ ɔ-character shape frame of the optical sensor 9 which was fixed as the detection means, and cuts the outer peripheral rim of the wafer 13 with sensor light in a circular arc. Thereby, the center position of the wafer 13 is calculated by measurement, the transition quantity and the positional co-ordinate of the outer peripheral rim of the wafer are calculated by the above-mentioned transition quantity calculating means, and the position of the wafer on the holding portion 14 of the carrying arm 12 is determined.

The transition quantity calculated is transmitted to the control portion 11 which controls the motion of the carrying arm 12, and the carrying position and carrying route are corrected by adding a corrected value considering the transition quantity to the information of the carrying position preliminarily taught. Further, the sensor 9 as the detection means in FIG. 16 is set at a fixed position against the carrying robot 4 and a position at which the disc-like object 13 can be detected when the carrying arm 12 holding the wafer 13 is rotated.

The vacuum robot 31 in the processing device 3 at the right side of FIG. 16 carries out also the teaching of the reference positions in the respective load lock chamber 8 and respective processing chambers 7 and the positioning for correcting a position after receiving the wafer 13 using a sensor as the detection means.

[Case 1 being Adopted for Positioning Device (Aligner)]

Figure 17:
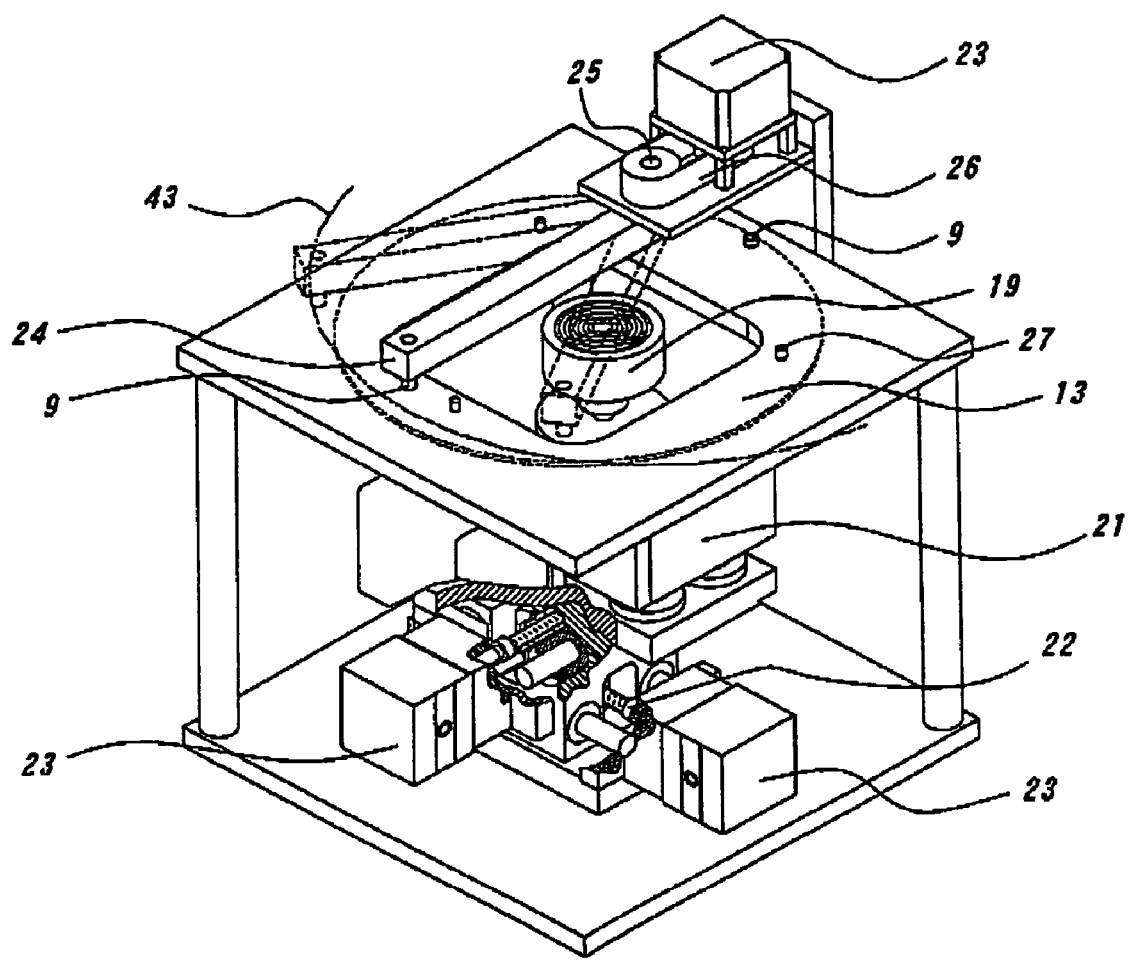
FIG. 17 is a partially notched cross-eyed view illustrating one Example of a positioning device for carrying out the present invention.

FIG. 17 shows one Example in which the positioning method of the present invention is used for the positioning device. The positioning device 10 is equipped with a holding stand 19 capable of adsorbing the wafer 13 in vacuum and equipped with a rotation means, an X-axis transfer means and a Y-axis transfer means which can transfer to one direction or 2 directions and an elevator means 21, under the holding stand 19. Hereat, a detection arm 24 provided on a stage is rotated in a condition in which the wafer 13 mounted by the carrying robot 4 and the like is left alone, to draw a detection locus 43, and 2 points on the outer peripheral rim of the wafer 13 are detected by the optical sensor 9 as the detection means which was provided at the edge portion of the detection arm 24. The center of the wafer is calculated using the two points and applying the calculation method of the present invention which was described above, the correction of an X-axis direction and Y-axis direction is carried out, the wafer which was held in replacement and placed at a normal position is rotated, and another sensor detects a notched portion on the rim portion of the wafer 13 to stop the rotation.

[Case 2 being Adopted for Positioning Device (Aligner)]

Figure 18:
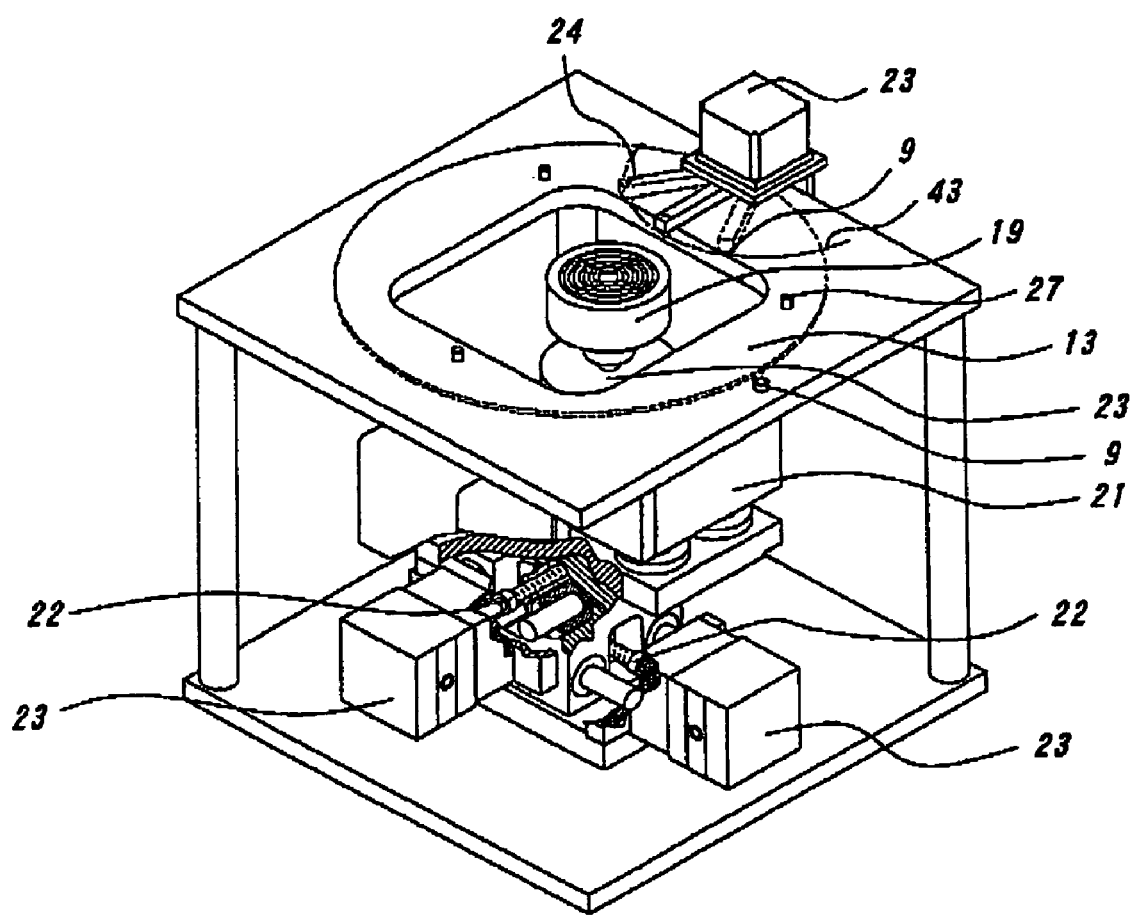
FIG. 18 is a partially notched cross-eyed view illustrating another Example of a positioning device for carrying out the present invention.

FIG. 18 shows the positioning device 10 with respect to a case that the detection arm 24 is shorter than the radius of a wafer and the operation method and positioning method are similar as FIG. 17.

[Case 3 being Adopted for Positioning Device (Aligner)]

Figure 19:
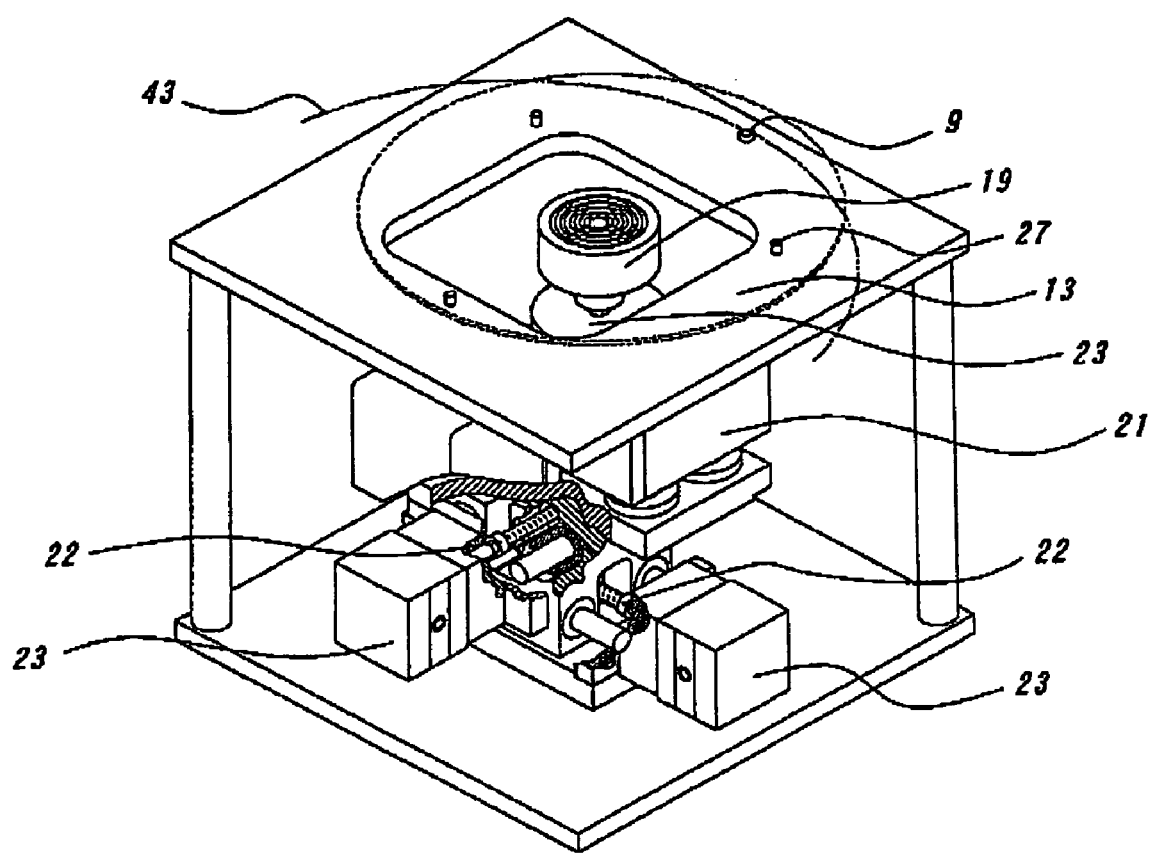
FIG. 19 is a partially notched cross-eyed view illustrating other one Example of a positioning device for carrying out the present invention.

FIG. 19 shows a case that the positional detection method of the present invention is carried out by a conventional positioning device. The positioning device 10 is equipped with the holding stand 19 which can be rotated, an X-axis transfer means and a Y-axis transfer means, an elevator means and the point sensor 9 as the detection means. When the wafer 13 rotated is eccentric, two points are detected by cutting the rim portion of the wafer by the detection route 43 with the same radius as the wafer 13 by rotation. The positioning method thereafter is similar as FIG. 17.

Figure 20:
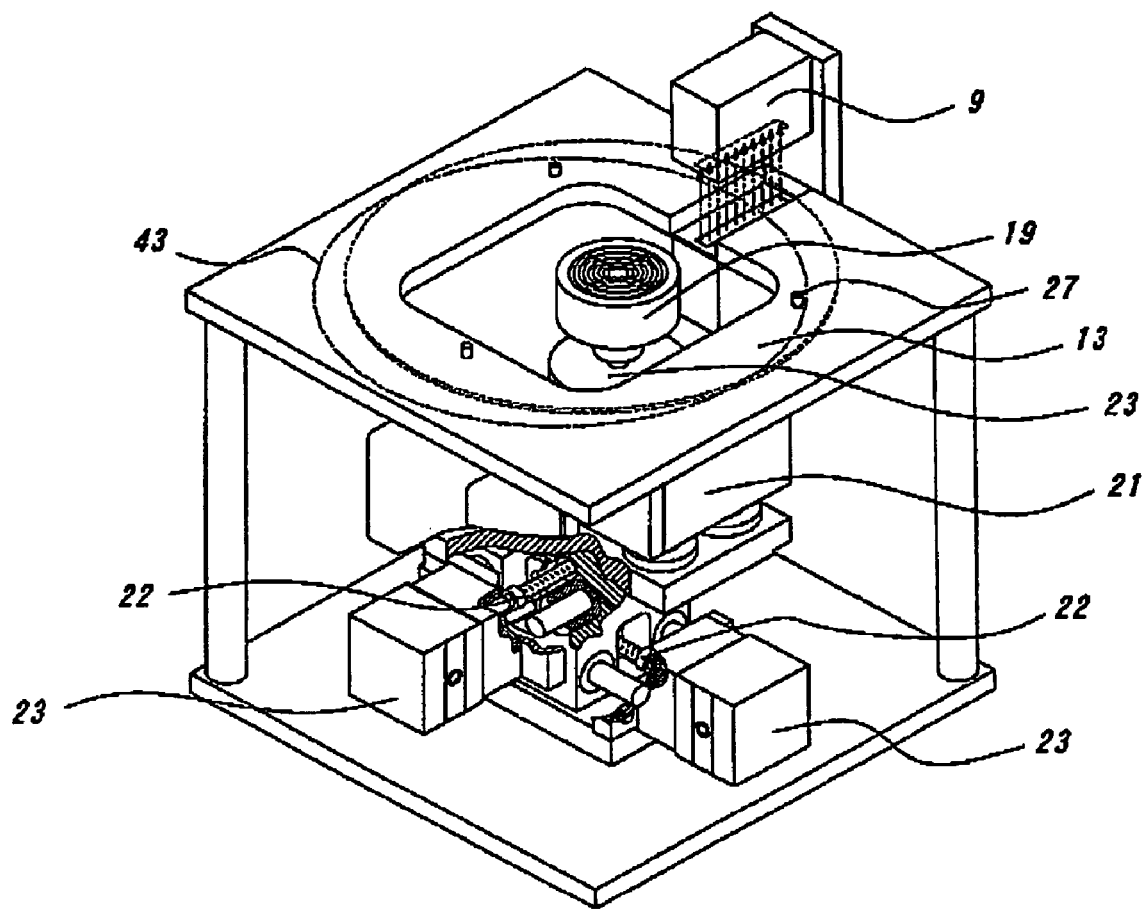
FIG. 20 is a partially notched cross-eyed view illustrating other one Example of a positioning device for carrying out the present invention.

Conventionally, the positional information of a disc-like object for the disc-like object which was carried to a mounting stand by the caring robot and the like is obtained by a detection method shown in JP-A-6-224285 which uses an optical line sensor. In the method, the mounting portion is driven by rotation and the positional information of a rim portion by one cycle is required to be detected. As shown in FIG. 20, when the portion of a rim portion is out of the detection range of a line sensor, an X-axis transfer means and a Y-axis transfer means are driven, and the positioning motion is carried out in assumption that the disc-like object is held in replacement so as to be within a detection range. Then, when the positioning method of the present invention is used, other portion enters in the sensor by rotation without fail even If the portion of the rim portion is out of the detection range; therefore if one point on the line sensor is determined as a detection point, the center positional information of a disc-like object is calculated by the center position calculating method of the present invention in like manner as FIG. 19. Namely, holding in replacement is not required at all and the center of a wafer can be calculated.

Figure 21:
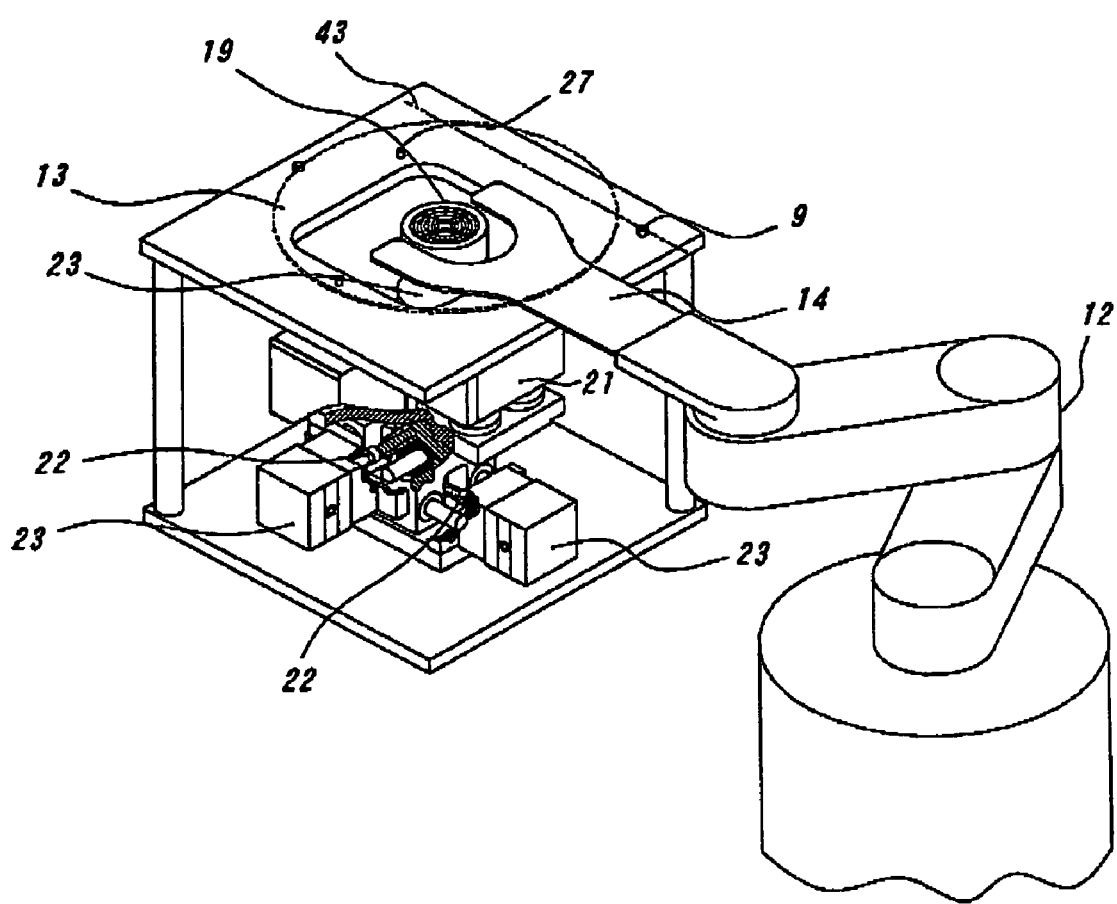
FIG. 21 is a partially notched cross-eyed view illustrating other one Example of a positioning device for carrying out the present invention.

Further, if the center position of a wafer is grasped, the X and Y driving portions of the positioning device are unnecessary, and as shown in FIG. 21, the disc-like object 13 can be positioned by operating the carrying robot 4 and moving the holding portion 14 to a normal position before mounting.

[Sensor to Holding Portion]

Figure 22:
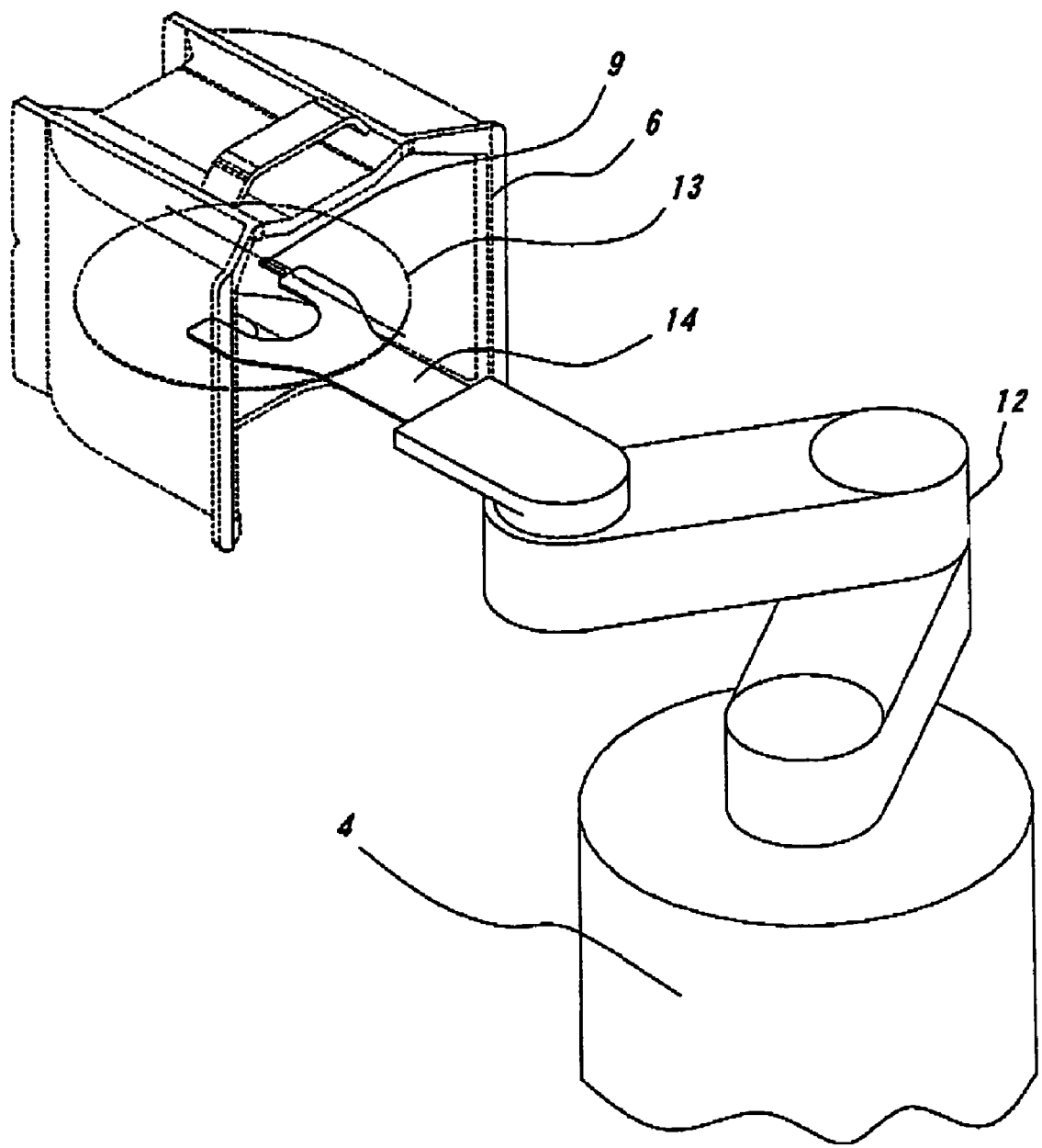
FIG. 22 is a partially notched cross-eyed view illustrating one Example of detecting and positioning a notched portion according to one detection means of the present invention.

As shown in FIG. 22, the sensor 9 is provided at the edge or side portion of the holding portion 14 of the carrying robot 4, two points on the outer peripheral rim of the disc-like object 13 mounted are detected by the rotation and bending and stretching motion of the carrying robot 4, and the center position of the disc-like object 13 can be calculated. Further, when it is judged whether a notched portion and the like are duplicated on the detection route or not, two detection means are provided at the holding portion 14 by the methods shown in FIG. 10 and FIG. 11, or the disc-like object 13 shall be scanned twice by one detection means.

[Sensor to Port Door]

Figure 10:
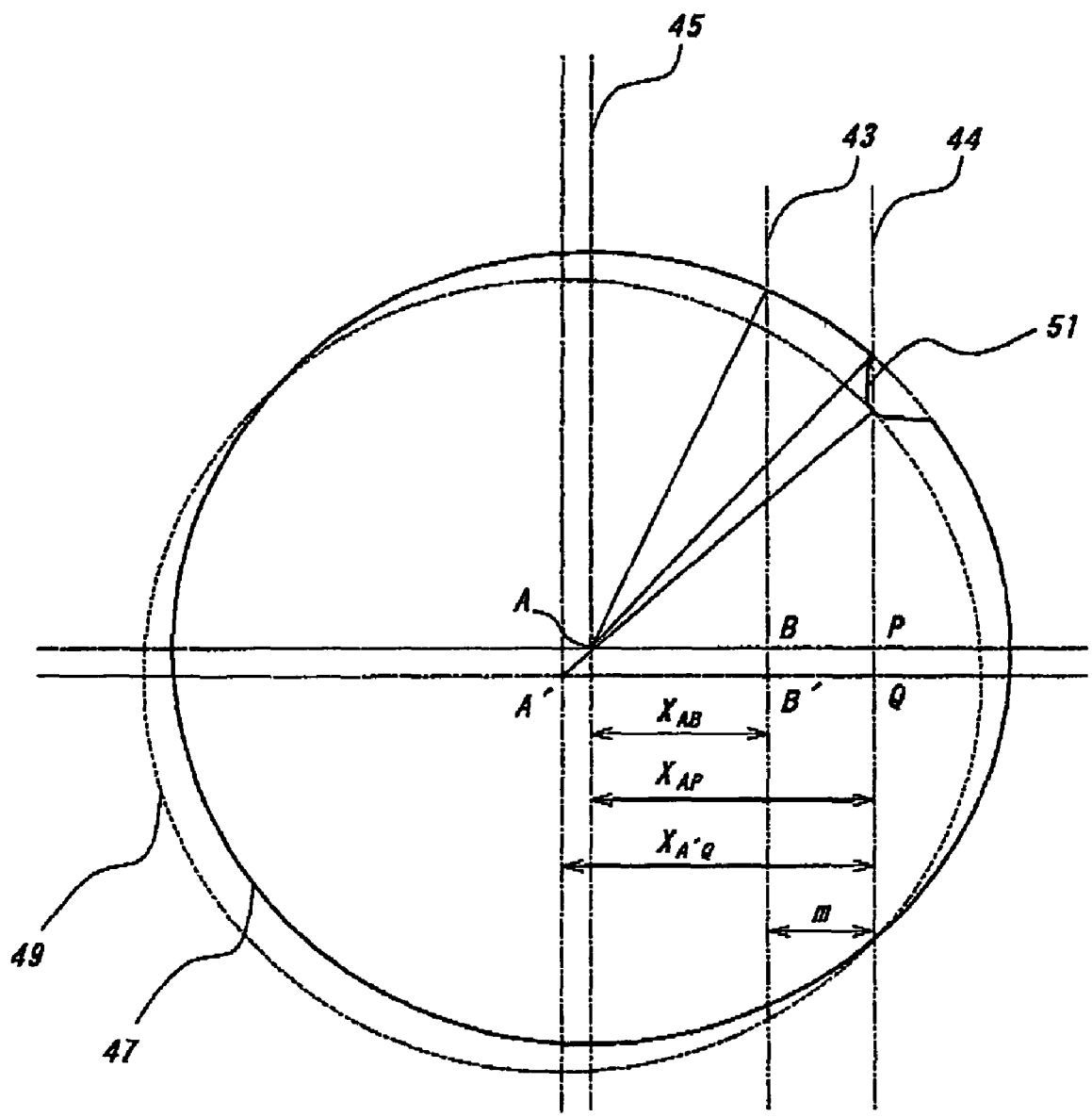
FIG. 10 is a plane view illustrating the principles of detecting and positioning a notched portion according to two detection means of the method of the present invention.
Figure 11:
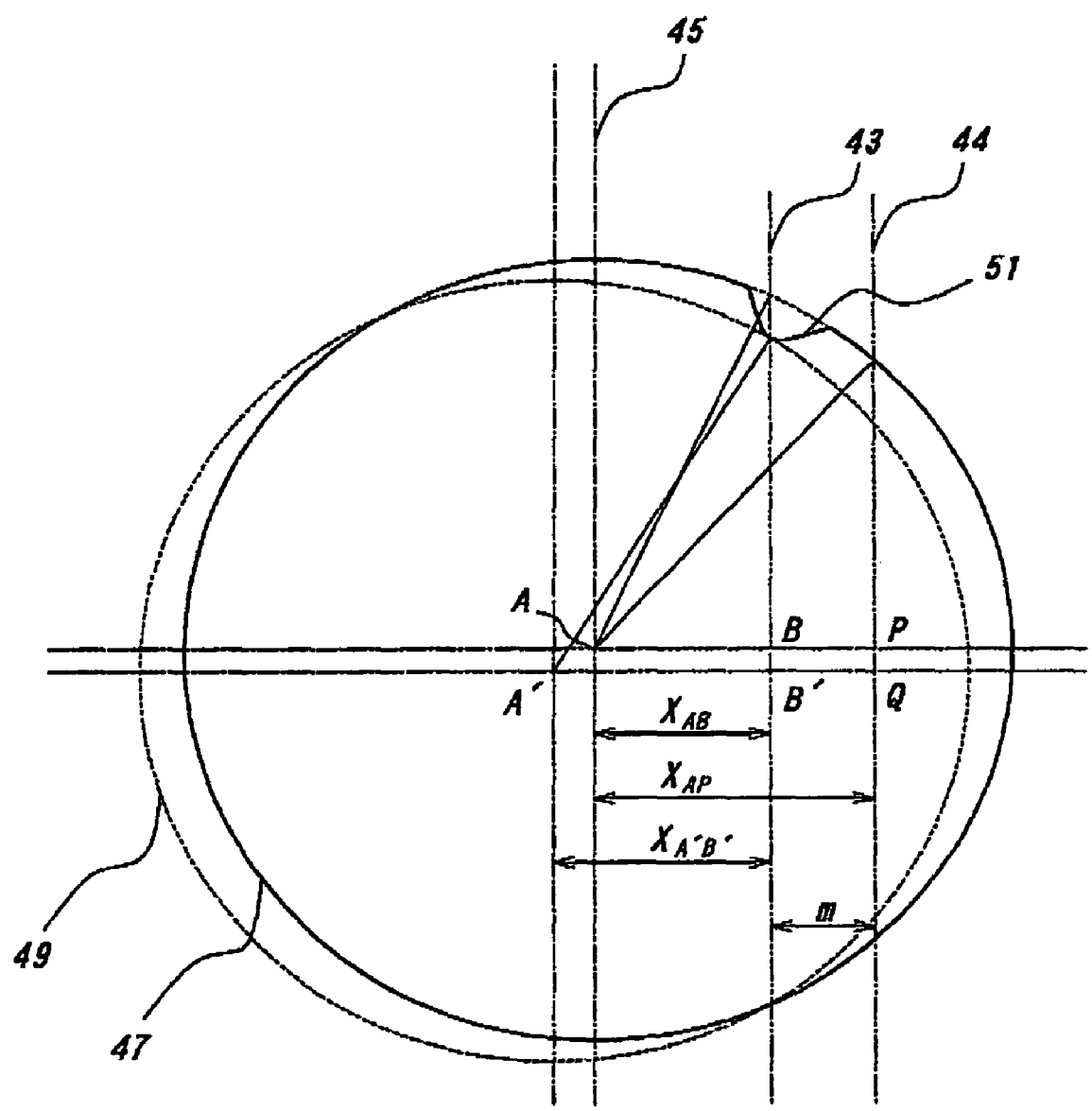
FIG. 11 is another plane view illustrating the principles of detecting and positioning a notched portion according to two detection means of the method of the present invention.
Figure 12:
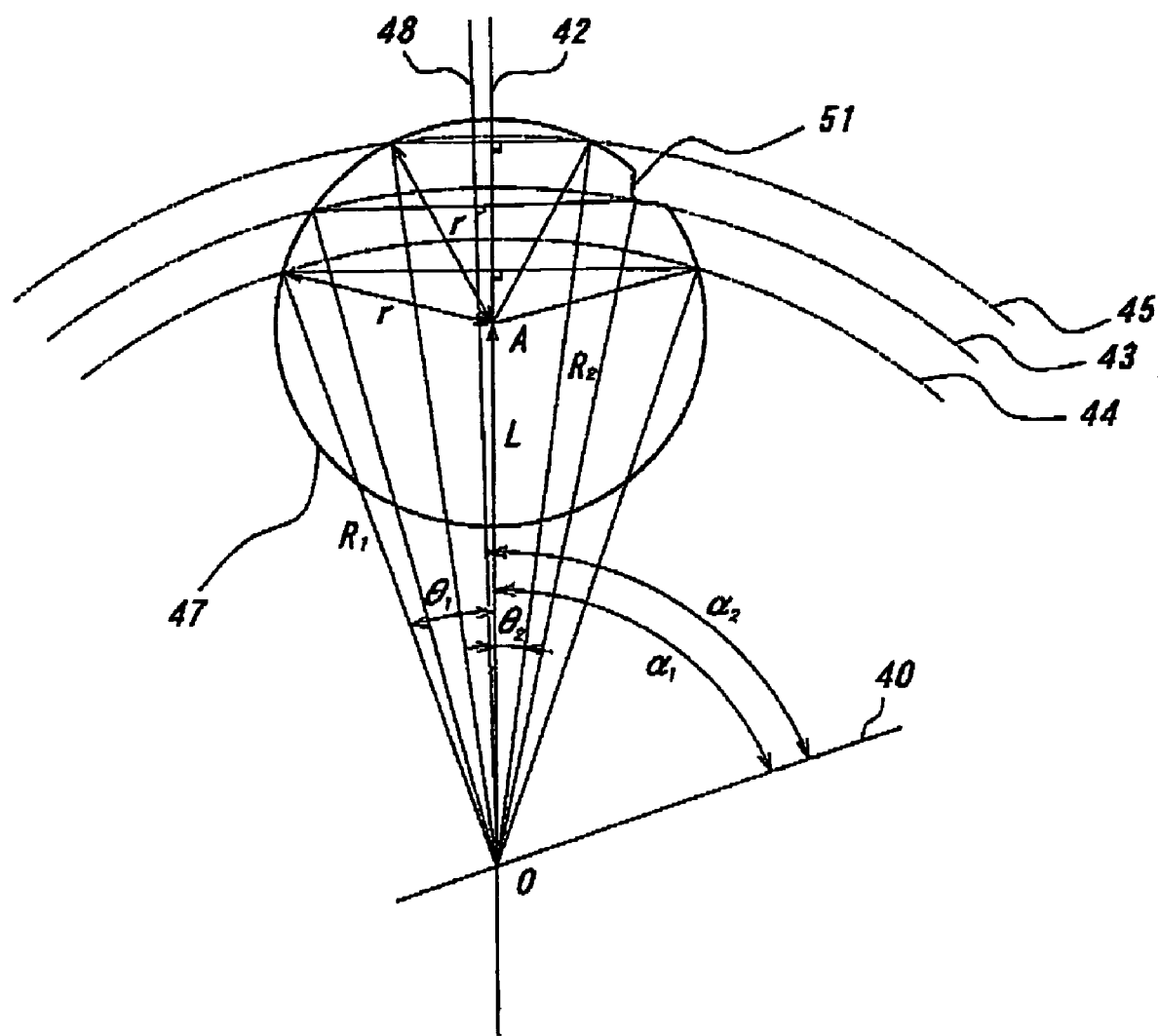
FIG. 12 is a plane view illustrating the principles of calculating the radius of a disc based on the method of the present invention.
Figure 23:
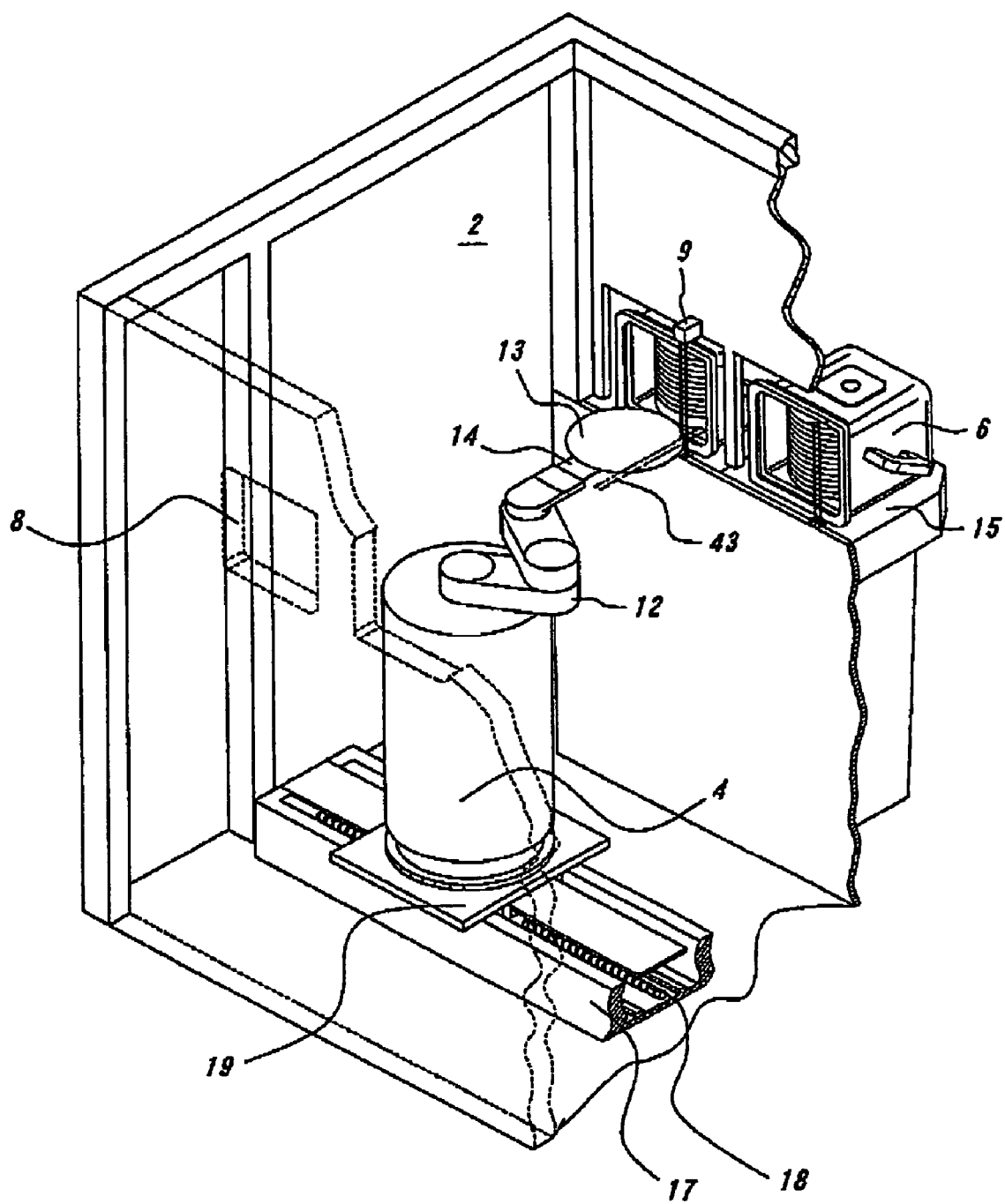
FIG. 23 is a partially notched cross-eyed view illustrating one Example of detecting and positioning a notched portion according to two detection means of the present invention.

In FIG. 23, two sensors 9 are installed on a door for a cassette of the carrying device 2 (only one sensor is shown in the drawing), the carrying arm 12 of the carrying robot 4 is driven to be linearly moved, when the wafer 13 is taken out, its center is calculated to be positioned, and it is corrected to a correct route to other port to which it should be carried. The calculation method is shown in FIG. 10 and FIG. 11.

[Linear Movement]

Figure 24:
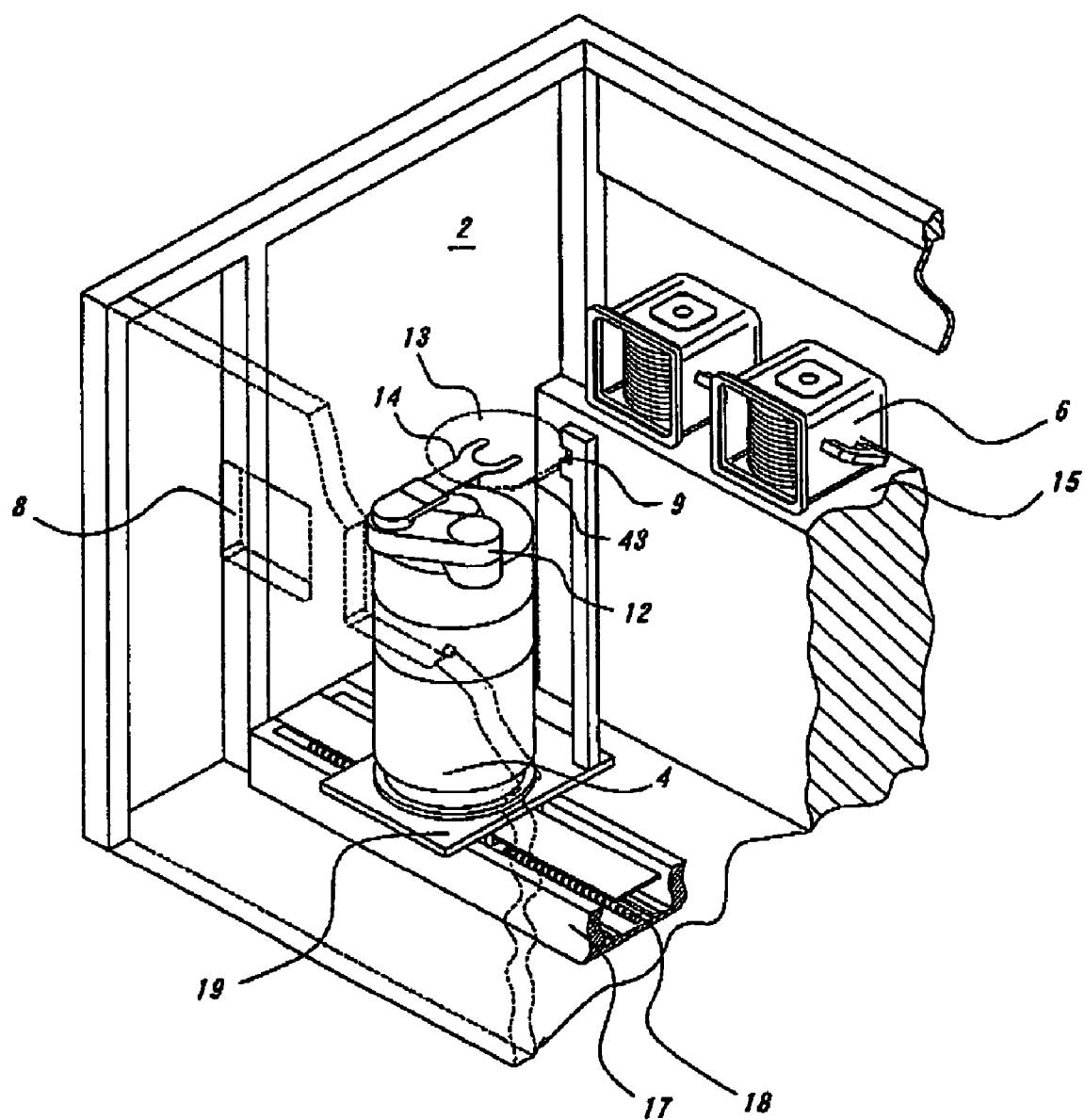
FIG. 24 is a partially notched cross-eyed view illustrating one Example of a carrying device for carrying out the present invention.

FIG. 24 is one Example of the positioning device of the present invention according to Claim 9. A detection means 9 which is composed of one sensor is provided being annexed to the carrying robot 4, the carrying arm 12 of the carrying robot 4 is driven to linearly move the wafer 13, and two points on the outer peripheral rim of the wafer 13 are detected. Its center is calculated by these to be positioned, and it is corrected to a correct route to other port to which it should be carried, The calculation method is previously shown in (Formula 12) to (Formula 15).

Figure 31:
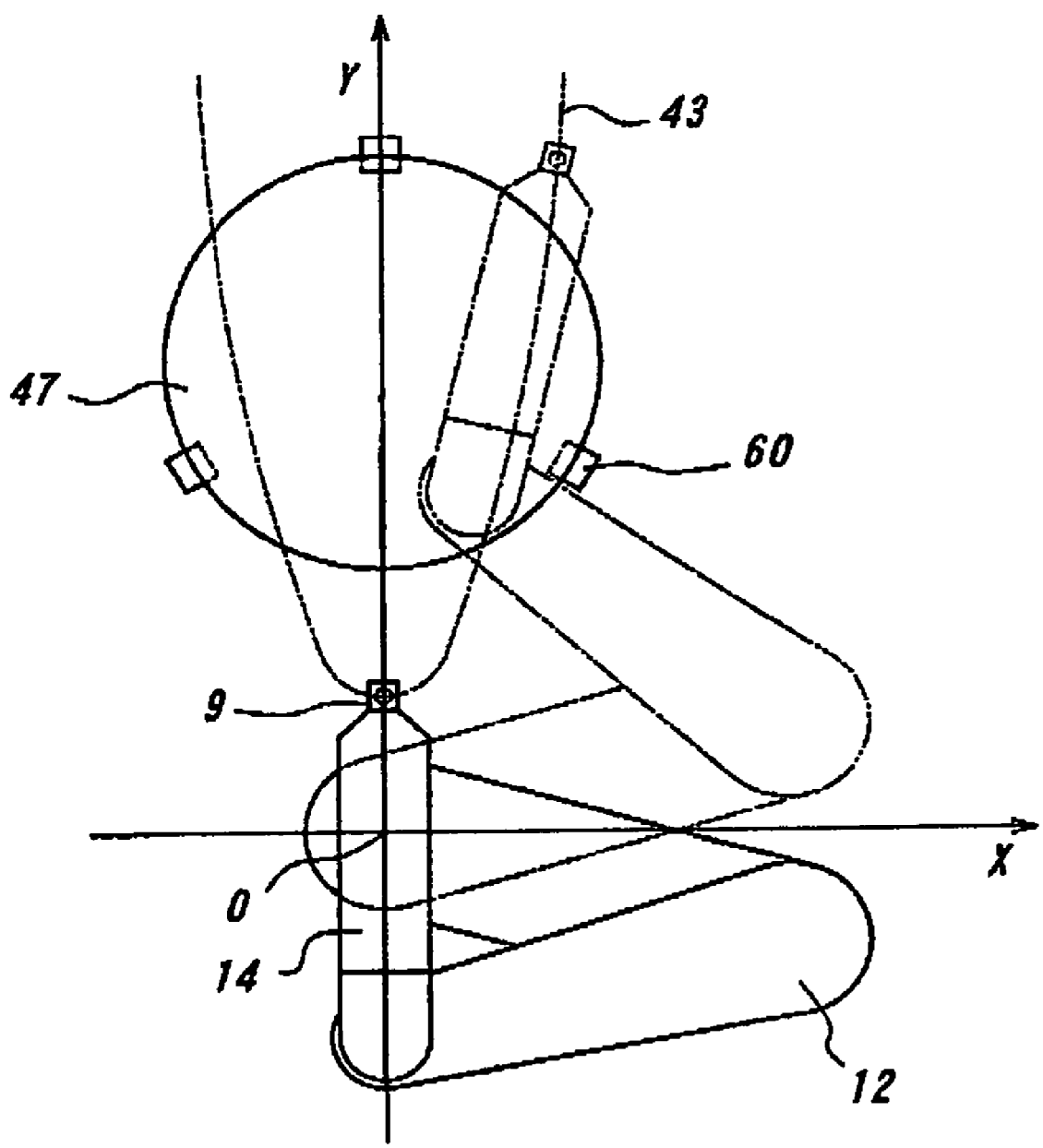
FIG. 31 is a plane view illustrating one Example of a method of determining a center point from 4 points on the peripheral rim of a disc-like object and a device thereof based on the present invention.
Figure 32A:
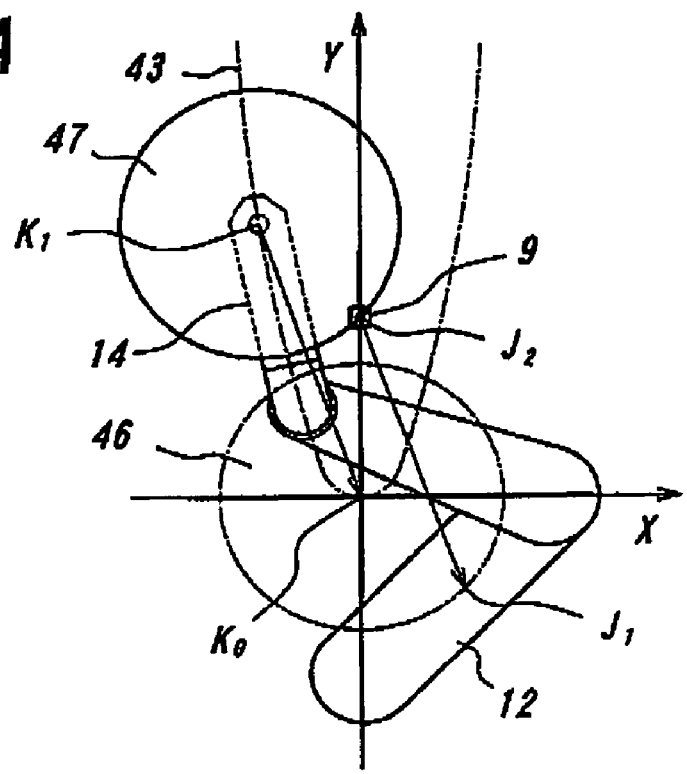
FIG. 32A and FIG. 32B are plane views illustrating other one Example of a method of determining a center point from 4 points on the peripheral rim of a disc-like object and a device thereof based on the present invention.
Figure 32B:
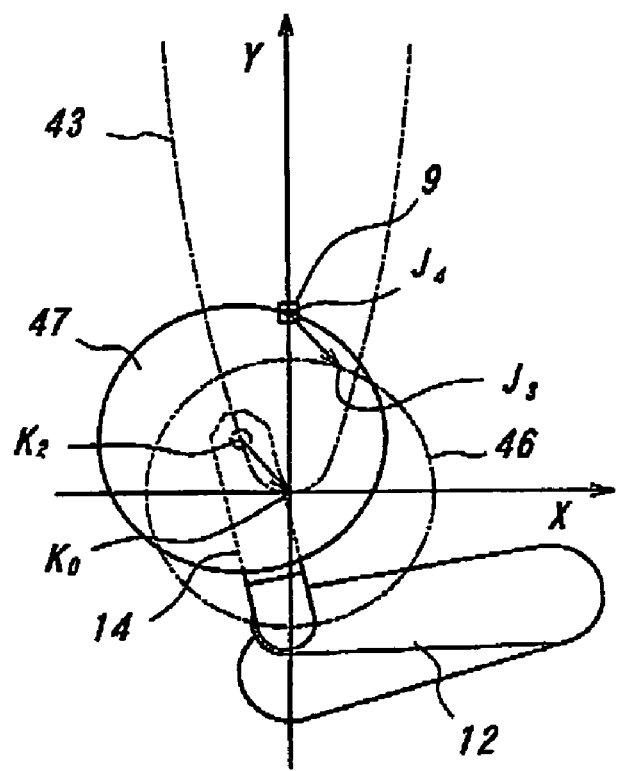

Then, with respect to Examples according to the second method and a device thereof of the present invention in which at least 3 points on the peripheral rim of a disc-like object with an unknown radius are detected by one detection means (sensor), a case that the disc-like object is mounted on a fixed position and the detection means is moved as FIG. 31 and a case that the detection means is fixed and the disc-like object is moved as FIG. 32A and FIG. 32B are separately illustrated.

Example A

In a device shown in FIG. 31, the sensor 9 as a one-point detection type detection means is provided at the edge of the holding portion of a carrying device. An optical reflective type sensor is preferable as the sensor 9, but known sensors may be used so far as they can detect the peripheral rim of the disc-like object. Hereat, the carrying robot as the carrying device and the disc-like object 47 are arranged on a reference co-ordinate system, the original point position is considered to be situated on the rotational center of the carrying arm 12 of the carrying robot for convenience, and the disc-like object 47 is mounted on a known mounting stand 60 and not moved. The co-ordinates of 3 points or 4 points on the peripheral rim of the disc-like object 47 are detected by moving the sensor 9 along the route 43 of the secondary curve on the reference co-ordinate system.

Example B

On the reference co-ordinate system of FIG. 32, the carrying robot and the sensor 9 as the carrying device whose positions are known are fixed. The disc-like object 47 is fixed by adsorption on the holding portion 14 of the carrying arm 12 of the carrying robot. When the specific point on the holding portion 14 is moved along the quadrant curve locus 43, the sensor 9 detects 3 points on the peripheral rim of the disc-like object 47. As shown in FIG. 32A, when the sensor 9 is going to be hidden in the disc-like object 47, the image of the specified point $K_1$ on the holding portion 14 becomes an original point $K_0$ by the representation (transfer) from the position of the disc-like object 47 to the disc-like object 46, and the image of a point $J_2$ on the peripheral rim which was detected by the sensor 9 is moved in parallel to a transfer straight line to the original point and represented to the point $J_1$.

As shown in FIG. 32B, a point $J_4$ being the second point is detected when the sensor 9 is going to be separated from the disc-like object 47, and represented to a point $J_3$ in accordance with the representation of the specified point $K_2$ on the holding portion 14 to $K_0$ at that time (the angle change of the disc-like object 46 by the angle change of the holding portion 14 is compensated).

The residual two points on the peripheral rim are detected at the symmetry positions of $J_1$ and $J_3$, but the center position and radius of the disc-like object 47 are detected using 3 points among these 4 points. When 3 points are detected, the motion of the holding portion may be stopped.

The intersection co-ordinate and the center co-ordinate of the disc-like object are calculated based on these measurement values, and used for the fore-mentioned reference position teaching method, automatic teaching method and the like.

Further, the positional calculation and the like for carrying out the automatic teaching method, automatic positioning method and automatic carrying method of the present invention shall be carried out by the control portion 11 of the carrying device 2 in the above-mentioned Examples, but the present invention is not limited to this, and a separate computer and the like which were connected with the above-mentioned control portion 11 may carry out it.

Further, the inputs of the initial value at the step S11 of FIG. 13, the step T1 of FIG. 14 and the step U1 of FIG. 15 are automatically carried out by performance of a program in the above-mentioned Examples, but the input may be manually carried out with keyboard operation and the like.

INDUSTRIAL APPLICABILITY

As illustrated above, according to the reference position teaching method and automatic positioning method of a disc-like object of the present invention, since a proprietary positioning machine is not specifically required, space reduction can be designed and a device cost can be also suppressed. Further, one or two cheap point sensors are also sufficient for the sensor being the detection means, and it could contribute to cost lowering.

By the way, in case of one sensor, since the co-ordinate of the sensor is determined, a light axis may be deviated a little and cost-down can be designed.

On the other hand, when motion by once and a plural number of sensors are used, through-put (productivity) can be improved and the teaching after maintenance can be easily carried out.

Further, according to the automatic teaching method and a device thereof based on the present invention, working steps can be steeply shortened in case of the semiconductor manufacturing equipment of FIG. 1 and working time can be reduced to about 1/10 to a conventional work, that is, about 1 to 2 hours. Further, since there is no manual error such as visual confirmation of a carrying position, a condition before working can be easily recovered even if maintenance is carried out. Furthermore, since the transition quantity can be carried out during carrying a disc-like object, the time of going and returning for carrying it to a positioning device was abbreviated and productivity was improved. Then, when a detection means is always operated and passes the detection means 9 according to requirement, positional deviation is detected; therefore it is managed whether the carrying is normally carried out or not and normal operation can be always carried out.

Additionally, since the unknown radius of a disc-like object can be measured and judged, wafers having different sizes can be simultaneously fed to a semiconductor processing equipment and processed if the radius is confirmed by every sheet with the device of the present invention, and the improvement of the rate of line operation and the productivity can be realized.

What is claimed is:

1. A method for automatically teaching a reference position which is a reference of a position of a disc-like object in a reference co-ordinate system including a position of a handling device to a handling device of the disc-like object, the disc-like object having no substantial concave or convex portions along a peripheral rim, the method comprising:
    a step of determining a center position of a disc-like object with a known radius which was situated at a fixed place being the reference position in the reference co-ordinate system; and
    a step of memorizing the position of the fixed place in the reference co-ordinate system which was determined by calculation based on the center position in the handling device as the reference position,
    wherein the step of determining the center position of the disc-like object comprises:
    a step of relatively moving a detection means against the disc-like object and making one locus of the detection means cross against a circumference of the disc-like object, a step of determining positions of two intersections by the crossing in the reference co-ordinate system, and a step of calculating the center position using a specific point on a perpendicular bisector of a section of a line combining the two intersections, the two intersections and the radius of the disc-like object.

2. The method for automatically teaching a reference position according to claim 1, wherein the locus of the detection means is a circular arc.

3. A method for automatically positioning a disc-like object with a known radius in a reference co-ordinate system including a position of a handling device of the disc-like object, comprising:

a step of determining a center position of the disc-like object in the reference co-ordinate system; and a step of calculating a transition quantity from a center position preliminarily taught to the center position determined in the reference co-ordinate system, wherein the step of determining the center position of the disc-like object comprises:

a step of relatively moving a detection means against the disc-like object and making one locus of the detection means cross against a circumference of the disc-like object, a step of determining positions of two intersections by the crossing in the reference co-ordinate system, and a step of calculating the center position using a specific point on a perpendicular bisector of a section of a line combining the two intersections, the two intersections and the radius of the disc-like object.

4. The method for automatically positioning the disc-like object according to claim 3, wherein the locus of the detection means is a circular arc.

5. An automatic carrying method of a disc-like object, comprising a step of carrying out the method for automatically positioning the disc-like object according to claim 3, further including:

a step of correcting a carrying route preliminarily taught to a holding portion of a carrying device as the handling device based on a transition quantity which was calculated by the positioning method, and a step of carrying the disc-like object to a fixed carrying position with the holding portion of the carrying device along the carrying route corrected.

6. A method for automatically positioning a disc-like object with a known radius, the disc-like object having one concave portion or one convex portion at one portion of a peripheral rim, in a reference co-ordinate system including a position of a handling device of the disc-like object, comprising:

a step of determining a center position of the disc-like object having the concave portion or the convex portion in the reference co-ordinate system, and a step of calculating a transition quantity from a center position preliminarily taught to the center position determined in the reference co-ordinate system, wherein the step of determining the center position of the disc-like object having the concave portion or the convex portion comprises:

a step of relatively moving a detection means against the disc-like object and making two loci of the detection means cross against a peripheral rim of the disc-like object, a step of determining positions of two pairs of intersections consisting of two points of each of the two pairs by crossing of the two loci with the peripheral rim of the disc-like object in the reference co-ordinate system, a step of calculating a center position of a circle when one of the two pair of intersections is situated on a circumference including the peripheral rim excluding the concave portion or convex portion using a specific point on a perpendicular bisector of a section of a line combining the two points of the one of the two pair of intersections, the two points of the one of the two pair of intersections and the radius of the disc-like object, for each of the two pairs of intersections, and a step of selecting the center position of the disc-like object based on a positional deviation direction of a central point when the intersections are situated at the concave portion or convex portion by comparing the two center positions calculated.

7. A method for automatically positioning a disc-like object with an unknown radius, the disc-like object having one concave portion or one convex portion at one portion of a peripheral rim, in the reference co-ordinate system including a position of a handling device of the disc-like object, comprising:

a step of determining a center position of the disc-like object having the concave portion or the convex portion in the reference co-ordinate system, and a step of calculating a transition quantity from a center position preliminarily taught to the center position determined in the reference co-ordinate system, wherein the step of determining the center position of the disc-like object having the concave portion or the convex portion comprises:

a step of relatively moving a detection means against the disc-like object, making three loci of the detection means cross against the peripheral rim of the disc-like object and determining the position of 3 pairs of intersections each consisting of one pair of 2 points in the reference co-ordinate system, a step of selecting a common perpendicular bisector among 3 perpendicular bisectors with respect to the intersections of the 3 pairs, and a step of calculating the radius of the disc-like object and the center position from a specific point on the common perpendicular bisector and 2 pairs of intersections with respect to the common perpendicular bisector.

8. The method for automatically positioning a disc-like object according to claim 7, wherein the loci of the detection means are circular arcs.

9. A device for automatically teaching a reference position which is a reference of a position of a disc-like object in a reference co-ordinate system including a position of a handling device of the disc-like object, comprising a control portion for executing the method according to claim 1, wherein the control portion includes a computer.

10. A device for automatically teaching a reference position which is a reference of a position of a disc-like object in a reference co-ordinate system including a position of a handling device of the disc-like object, comprising a control portion for executing the method according to claim 3, wherein the control portion includes a computer.

11. A device for automatically teaching a reference position which is a reference of a position of a disc-like object in a reference co-ordinate system including a position of a handling device of the disc-like object, comprising a control portion for executing the method according to claim 6, wherein the control portion includes a computer.

12. A device for automatically teaching a reference position which is a reference of a position of a disc-like object in a reference co-ordinate system including a position of a handling device of the disc-like object, comprising a control portion for executing the method according to claim 7, wherein the control portion includes a computer.

* * * * *